United States Patent [19]

Higgins et al.

[11] Patent Number: 5,334,962
[45] Date of Patent: Aug. 2, 1994

[54] HIGH-SPEED DATA SUPPLY PATHWAY SYSTEMS

[75] Inventors: Brian P. Higgins, Boise, Id.; David W. Gardner; Kerry D. Rhea, both of Colorado Springs, Colo.; Thomas E. Linnenbrink, Monument, Colo.; Rebecca S. Reed, Colorado Springs, Colo.; Peter C. T. Roberts, Sudbury, Mass.

[73] Assignee: Q-Dot Inc., Colorado Springs, Colo.

[21] Appl. No.: 530,461

[22] Filed: May 29, 1990

Related U.S. Application Data

[63] Continuation of Ser. No. 269,765, Nov. 10, 1988, abandoned, which is a continuation-in-part of Ser. No. 99,450, Sep. 18, 1987, abandoned.

[51] Int. Cl.$^5$ .......................... H01P 5/00; H01L 23/12
[52] U.S. Cl. ...................... 333/247; 257/728
[58] Field of Search ............... 333/100, 124, 125, 136, 333/245, 247; 361/414; 370/85.1; 375/36; 257/664, 691–693, 728

[56] References Cited

U.S. PATENT DOCUMENTS

| | | |
|---|---|---|
| 3,155,881 | 11/1964 | St. Jean . |
| 3,801,938 | 4/1974 | Goshgarian . |
| 3,825,805 | 7/1974 | Belohoubeck et al. . |
| 4,247,817 | 1/1981 | Heller .................. 333/136 X |
| 4,414,480 | 11/1983 | Zasio .................. 307/443 |
| 4,450,623 | 5/1984 | Burr .................. 29/850 |
| 4,544,442 | 10/1985 | Lassen .................. 156/643 |
| 4,551,746 | 11/1985 | Gilbert et al. .................. 357/74 |
| 4,593,243 | 6/1986 | Lao et al. .................. 324/158 P |
| 4,602,318 | 7/1986 | Lassen .................. 361/414 |
| 4,626,805 | 12/1986 | Jones .................. 333/333 |
| 4,627,076 | 12/1986 | Staal et al. .................. 375/36 |
| 4,641,140 | 2/1987 | Heckaman et al. .................. 342/371 |
| 4,646,436 | 3/1987 | Crowell et al. .................. 29/850 |
| 4,695,810 | 9/1987 | Heckaman et al. .................. 333/1 |
| 4,712,077 | 12/1987 | Ansell et al. .................. 331/25 |
| 4,733,209 | 3/1988 | Paynting .................. 333/205 |
| 4,744,076 | 5/1988 | Elias .................. 370/85 |
| 4,751,482 | 6/1988 | Fukuta et al. .................. 333/247 |

OTHER PUBLICATIONS

GigaBit Preliminary Product Bulletin 10G012-4.
Drawing of integrated circuit connections, including Japanses text and bearing no date or statement of origin.

Primary Examiner—Paul Gensler
Attorney, Agent, or Firm—Fitch, Even, Tabin & Flannery

[57] ABSTRACT

The high speed data pathway system is used to convey data signals to integrated circuits connected to mother and daughter boards. The integrated circuits include a package and an integrated circuit chip carried by the package. An internal transmission line is carried by the package and coupled to the integrated circuit chip. The package includes both input and output connections for the internal transmission line. A high speed pathway is formed by serially connecting the internal transmission lines with external transmission lines to form a unified transmission medium. Advantageously, the internal transmission lines, external transmission lines and the connection between them have substantially corresponding characteristic impedances.

7 Claims, 24 Drawing Sheets

Lp = 1.75 nH   Lb = 1.5 nH
Cp = 0.9 pF    Cg = 0.3 pF
Td = 50 ps     Zo = 50 Ω

MEASURED MAGNITUDE RESPONSE OF THE 14-TAP BUS

CALCULATED DELAY OF 1.1 INCHES OF MULTIWIRE COAX $$t_d = \frac{\sqrt{\varepsilon_r}}{c} \cdot 1 = 138 \text{ps}$$

MEASURED DELAY OF 1.1 INCHES MULTIWIRE COAX $$t_d = \frac{3 \text{ ns}}{2 \text{ ft}} \times \frac{1 \text{ ft}}{12 \text{ in}} \times 1.1 \text{ in} = 137.5 \text{ps}$$

FLEXTRONICS GIGABIT CERAMIC INSERT
01-15-87

ORIGINAL MODEL PARAMETERS FIG. 28a

MODIFIED MODEL PARAMETERS
MAGNITUDE RESPONSE OF THE 5-TAP BUS MODEL

ORIGINAL MODEL PARAMETERS FIG. 29a

MODIFIED MODEL PARAMETERS
MAGNITUDE RESPONSE OF THE 7-TAP BUS MODEL

ORIGINAL MODEL PARAMETERS FIG. 30a

MODIFIED MODEL PARAMETERS
MAGNITUDE RESPONSE OF THE 14-TAP BUS MODEL

ID.

HIGH-SPEED DATA SUPPLY PATHWAY SYSTEMS

This invention was made with Government support under Air Force Contract Nos. F33615-84-C-1554 and F33615-85-C-1852.

The Government has certain rights in this invention. This application is a continuation of application Ser. No. 269,785 filed Nov. 10, 1988, now abandoned, which is a continuation-in-part of application Ser. No. 099,450 filed Sep. 18, 1987, now abandoned, which is incorporated by reference herein.

BACKGROUND OF THE INVENTION

The present invention is directed to electrical data pathway structures for very high-speed digital data transfer. High-speed integrated circuits such as gallium arsenide digital memory chips, microprocessors and logic components and superconductive Josephson junction devices have access or processing cycle times of about one nanosecond or less. However, a significant limitation on the performance of data processing systems utilizing such high speed devices is the speed of the data pathway system which interconnects the components of the system. Conventional data pathway backplane systems such as typical motherboard-daughterboard data pathway circuit board interconnection systems do not function at speeds adequate to realize the full potential of high speed integrated circuits. Very high speed backplane data pathway systems operating at speeds up to and greater than 500 megahertz would be desirable for more fully realizing the potential processing speed of such systems. Moreover, fast gallium arsenide or other very high speed digital data processing devices are typically synchronized with a master clock, requiring transmission of a clock signal to each circuit component or subsystem which is required to operate synchronously with the other components. However, while high speed signal transmission may be readily accomplished from one transmitter to one or two single receivers, the provision of data bus taps for multiple receivers distributed along a signal line creates complex, cumulatively interactive impedance variations which impede digital signal transmission at high speeds. Typically at high signal rates, interference from multiple taps (which generally increases with the number of taps) is so pronounced that component system fan out is significantly limited (e.g., to two clock ports), thus requiring excessive buffering for interconnection of multiple components, increased component count and resulting cycle delays. Accordingly, in order to fully utilize the high processing speed capabilities of integrated circuits such as those made from high electron mobility III–V materials, there is a need for passive and active high speed integrated circuit interconnection systems which are capable of transmitting and/or receiving digital data electrically at high speed from single or multiple sources to one or more of multiple target receivers. In this regard, passive high-speed data transmission systems including various array processing architectures, redundant processing architectures and systems utilizing logic fanout to multiple receiver barrels would be desirable which can function at speeds up to 500 MHz or more. There is also a need for active, high speed integrated circuit interconnection systems capable of both transmitting and receiving information from multiple sources and targets at very high data transmission rates, such as 500 MHz to 2 Gigahertz or more. Such systems would facilitate highly concurrent (pipelined) data processing structures, allow "handshake" capability for enhanced system designs, facilitate high performance systems utilizing multiple processor boards in complex systems, and provide multiple memory board designs without creating excessively large bus structures.

Accordingly, it is an object of the present invention to provide very high-speed (e.g., 500 megabit per second to 2 or more gigabits per second data transmission rate per channel) data transmission pathways for multiple receivers which permit effective utilization of very fast integrated circuit components. It is a further object to provide both passive and active high speed data transmission systems for transmitting to multiple receivers along the data pathway. It is a further object to provide integrated circuit components which are particularly suited for use in high speed data pathway systems. These and other objects of the invention will be apparent from the following description and the accompanying drawings.

DESCRIPTION OF THE DRAWINGS

FIG. 15b is a side view of FIG. 15a;

FIGS. 28(a) and 28(b) are illustrations of the magnitude response of a 5-tap bus model of the system of FIG. 1;

FIGS. 29(a) and 29(b) are illustrations of the magnitude response of a 7-tap bus model of the system of FIG. 1;

FIGS. 30(a) and 30(b) are illustrations of the magnitude response of a 14-tap bus model of the system of FIG. 1.

DESCRIPTION OF THE INVENTION

Figure 1:
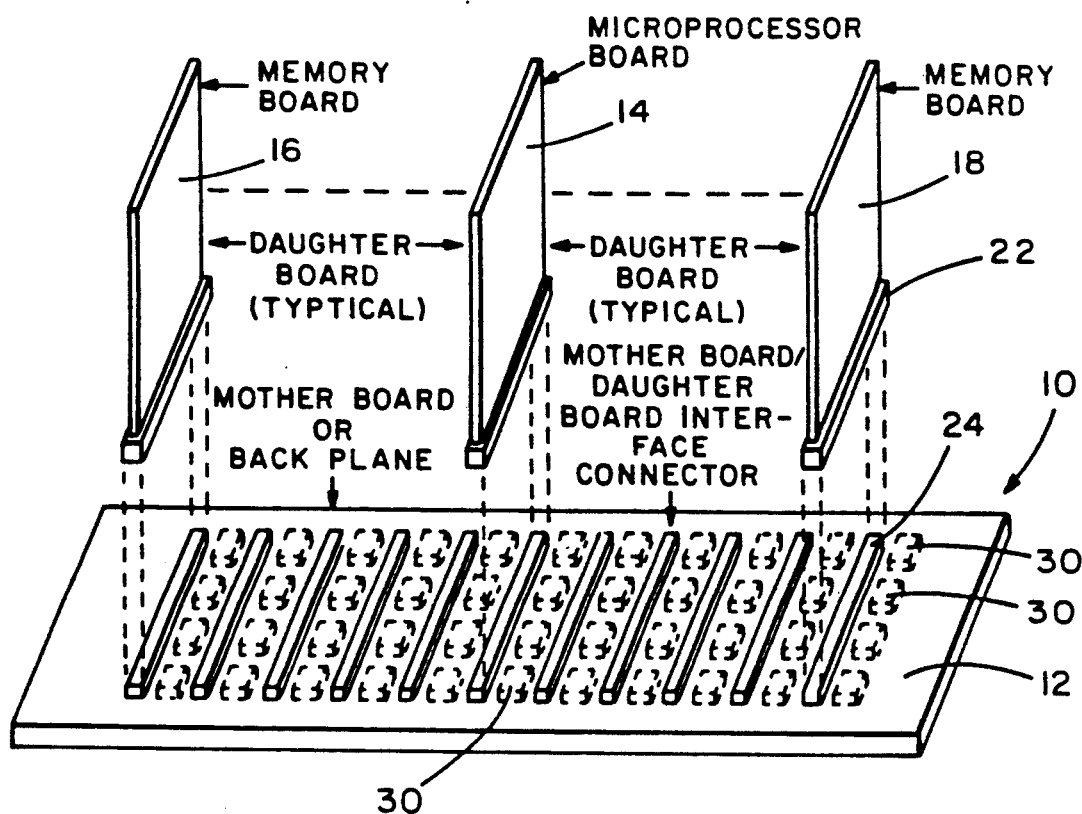
FIG. 1 is a perspective view of a high-speed data processing backplane system having differential signal line pairs each adapted to transmit digital data at a rate substantially greater than one gigabit per second.
Figure 2:
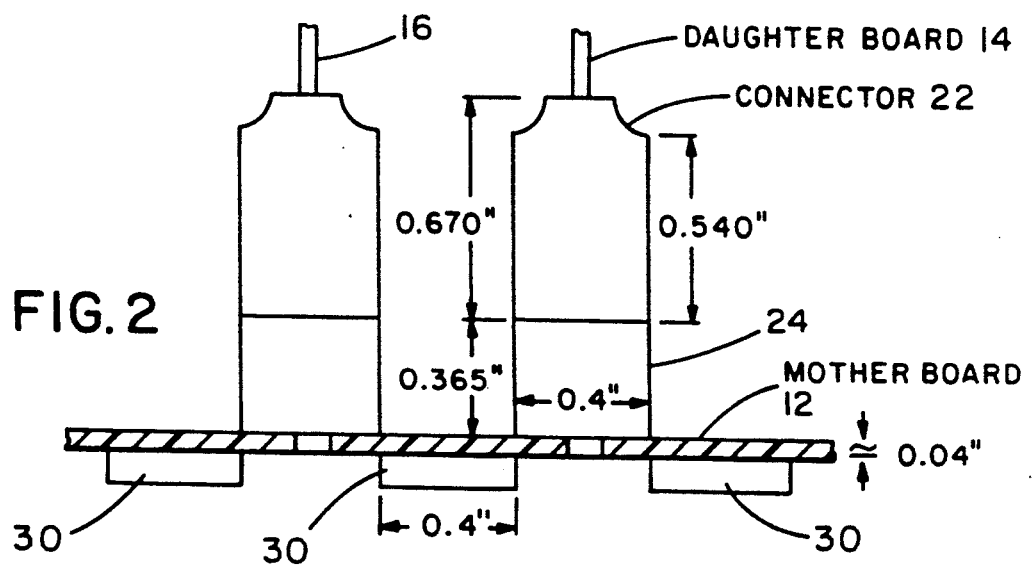
FIG. 2 is a cross sectional side view of the motherboard of the high-speed backplane system of FIG. 1, illustrating the dimensions and placement of active buffering chips and daughterboard pin connectors.

Generally, the present invention is directed to substantially stubless, very high-speed electronic digital data pathway transmission systems for providing a digital signal to a plurality of signal receivers distributed along the digital data pathway, which utilize low impedance, substantially through-package transmission line architectures. Such high speed digital data bus systems may comprise a plurality of active integrated circuit packages each having at least one continuous, internal, substantially non-reflective transmission line therethrough having a contact with a low impedance, high speed, transceiver integrated circuit means for receiving or transmitting a digital signal.

The one or more internal transmission lines have a predetermined impedance. The plurality of active integrated circuit packages are interconnected by external transmission line segments each having an impedance substantially corresponding to the impedance of the internal transmission lines of the active IC packages to provide at least one continuous data bus transmission line through a plurality of external transmission line segments and internal package transmission lines. The continuous data bus transmission line is terminated at at least one end by an appropriate impedance termination means for minimizing digital signal reflection. Desirably, the data bus will comprise a plurality of such data bus transmission lines, and the transmission line will be differential transmission line pairs terminated at each pad end by a termination impedance of about twice the predetermined impedance of the internal transmission lines and the external transmission line segments.

The length of the transmission line segments will desirably be less than about 1.0 inch, and the length of the active IC packages will desirably be less than about 0.75 inches. The distance between the active IC packages will desirably be about 0.5 inch or less. The interconnecting external segments are desirably formed in a data bus circuit board configuration, with the active IC package elements mounted on the circuit board. The active IC package elements also may be in electrical communication with input/output terminals for communication with other system components. These components may be mounted on daughterboards connected to the data bus circuit board.

The present invention is also directed to "in-and-out" substantially stubless, packaged integrated circuit devices which may be utilized as active or passive, transmitting or receiving, components in very high speed digital data pathway systems.

Such in-and-out packaged integrated circuit devices generally comprise an integrated circuit package, a high speed integrated circuit chip mounted in said package, said integrated circuit chip having at least one first I/O connection terminal for electrical communication with the circuitry of said chip, a plurality of electrical connection leads extending from said package, at least one of said connection leads being an input transmission line lead and at least one of said leads being an output transmission line lead, and at least one internal transmission line connecting said input transmission lead with one of said first I/O connection terminals, and connecting said first I/O connection terminal with said output lead, such that a signal applied to said input lead is transmitted to said first connection terminal and to said output lead by said internal transmission line without substantial degradation of said signal.

The present invention is also directed to very high speed digital data processing methods and apparatus utilizing very high speed data transmission pathways. Such methods and apparatus include pipelined systems having a predetermined, constant transmission time between processors and memories, parallel processing systems operating from a simple clock signal, and very high speed signal processing systems.

As indicated, various aspects of the present invention are directed to high speed electronic digital pathway systems which utilize substantially stubless through-chip transmission line structures. Particularly preferred systems utilize differential transmission line systems in which the digital signals are transmitted as a differential signal between two transmission lines. However, single transmission line systems in which digital signals are transmitted as digital signal pulses with respect to a voltage reference, are also contemplated.

Preferred high-speed backplane differential transmission line systems in accordance with the present invention may be designed for transmission of digital data at speeds in the range of 500 megabits per second to 2 gigabits per second or more for each differential line pair, with a plurality of at least 3, and more preferably at least 5 transmission line receivers or transmitters distributed along the transmission line. Particularly desirable data bus transmission line systems have at least 10 substantially stubless receivers or transmitters distributed along the transmission line. Parallel data bus structures, such as a full-scale, 32-bit pathway having a corresponding total data transmission rate of, e.g., 16 gigabits per second to 64 gigabits per second may be readily provided by a parallel scaling of the differential transmission lines.

Illustrated in FIG. 1 is an embodiment 10 of a high-speed data processing system employing a high-speed data pathway system employing differential transmission lines in accordance with the present invention. The data processing system 10 comprises a very high-speed data bus backplane motherboard 12, which will be described in more detail hereinafter, together with a plurality of daughter-boards 14, 16, 18 which may be system components such as high-speed gallium arsenide memory arrays 16, 18, high-speed central processing units 14, array processing units, I/O communication boards for input and output communication external to the system 10, etc., which communicate with each other by means of the high-speed data pathway system of the motherboard 12.

Figure 5:
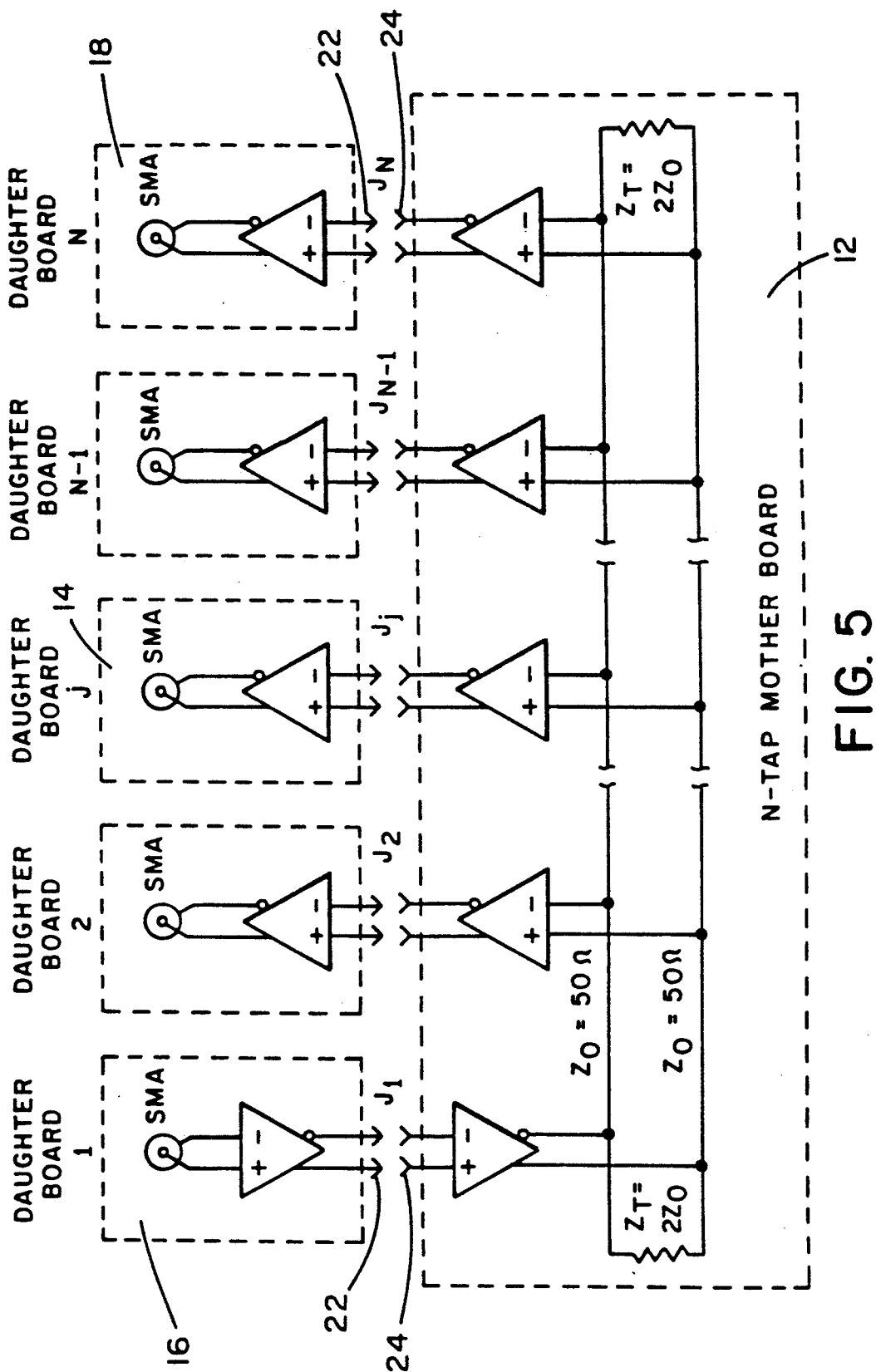
FIG. 5 is a schematic illustration of one of the n-tap single-bit bus differential transmission lines of the high-speed Gallium Arsenide backplane apparatus of FIG. 1.

In this type of configuration, data is transferred to and from various processor and memory cards by means of connections made to the data bus by connectors. At high edge rates, however, a conventional backplane data bus configuration behaves as a transmission line stub, and complex stub impedance discontinuities are introduced into the characteristic impedance of the bus in such a conventional system. Each of these discontinuities can cause reflections resulting in data errors being present on the bus. The significance of the discontinuities depends on the number of taps and their spacing, the length of the stub, the number of daughter-boards plugged into the bus, and the edge rate of the data on the bus. In accordance with the present invention, tap discontinuities are minimized by a means of an active interface placed between the bus and the daughterboard connectors (FIG. 5), as well as by means of a substantially stubless, through-package design for the active interface IC packages, to minimize the transmission-line loading of each daughterboard. In the absence of such an active interface, the discontinuity would consist of the connection to the connector, the motherboard/daughterboard connector, the connection to the components of the daughterboard, and the components themselves. By utilizing an active interface in a stubless through-package transmission line system, the discontinuity consists only of the minimized connection to the interface chip and the chip itself, and the active interface drives only the discontinuities associated With a single tap. The active interface also serves to provide substantially constant loading on the bus regardless of the number of daughterboards plugged into the bus. Furthermore, by using differential line receivers at each of the active interfaces, a substantial amount of gain is obtained to drive the daughterboard.

It is noted that the daughter-board elements are designed to interconnect with the mother-board by means of conventional connectors such as bristle brush, I/O connector and mating motherboard connectors 22, 24, respectively.

The connectors 22, 24 utilized for the motherboard/daughterboard interface in the illustrated embodiment 10 may be low impedance connector (e.g., a Bendix Bristle Brush connector pair), having an attenuation of about 1.6 dB at 2 GHz with a signal amplitude of 400 millivolts, although other connectors may also be utilized (such as a Hypertronics pin connector pair). The connectors should have an impedance matching the transmission line impedance, and should best have less than about 2 dB signal attenuation through the connector with clean signal transmission therethrough.

Figure 6:
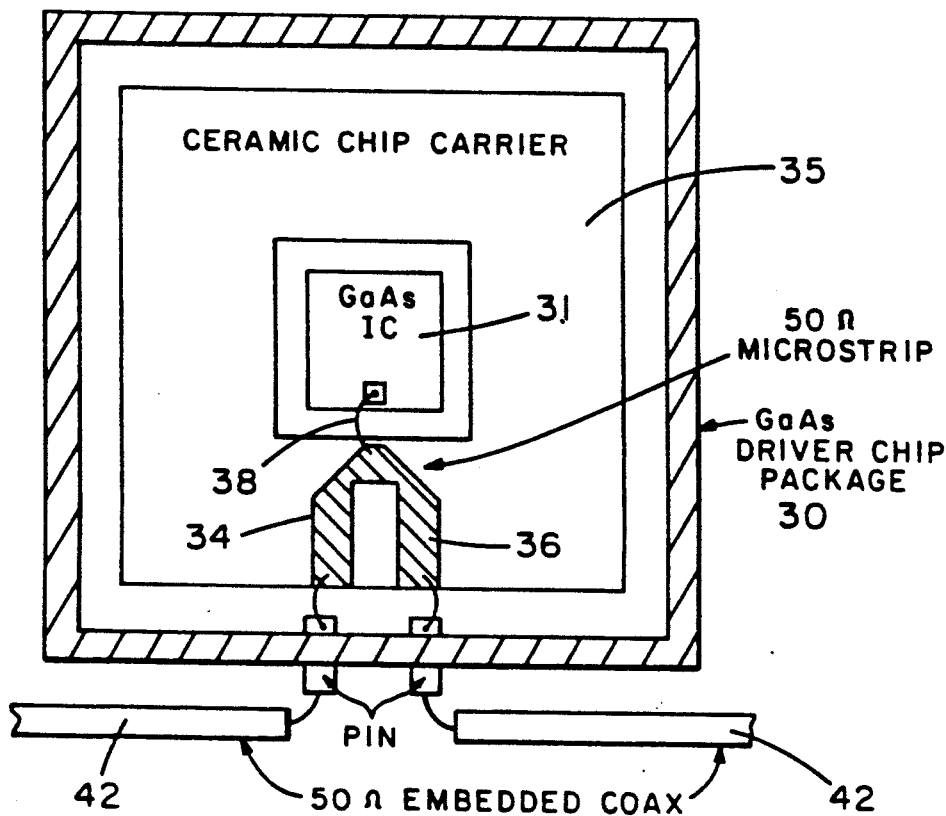
FIG. 6 is a schematic top view, partially broken away, of the in-and-out (no-stub) high-speed integrated circuit package utilized in the apparatus of FIG. 1.

As indicated, the data pathway of the processing system 10 uses low-capacitance, high-speed GaAs bus drivers and receivers 30, mounted on the motherboard backplane 12, to isolate the data line from the large impedance perturbation caused by the connector. The GaAs bus drivers and receivers are mounted in substantially stubless in-and-out transmission line packages. An important feature of the data pathway system of the digital processor 10 of FIG. 1 is the use of a plurality of parallel differential transmission lines, each utilizing an in-and-out, through-package transmission line connection with high-speed gallium arsenide receiver/driver integrated circuits. The in-and-out differential transmission line system is illustrated in detail in FIGS. 3, 4 and 6. As illustrated in FIG. 6, the differential transmission line elements employ an in-and-out, substantially stubless packaging design which permits high-speed operation of the transmission line. As schematically illustrated in FIG. 6, the transmission line 42, which may comprise a small, coaxial wire such as a Goretex copper/expanded polytetrafluoroethylene/copper wire such as manufactured by the Multi-Wire Division of Kollmorgen Corporation, having a characteristic impedance of less than 75 ohms, and preferably 50 ohms or less, which connects through the gallium arsenide driver chip package 30 to minimize stub impedance as schematically shown in FIG. 6.

The illustrated motherboard 12 has a plurality of embedded coaxial transmission lines with interconnections made with 50 ohm shielded coaxial lines extending along the board between respective connectors 24 and active IC devices 30 as shown, for minimizing cross talk. Such embedded coaxial wire circuit boards may be of the type described in U.S. Pat. Nos. 4,544,442, 4,602,318 and 4,646,436.

The small diameter of the external coaxial transmission line segments of the illustrated embodiment (0.010" outer diameter) and the ability to have crossovers, allows high interconnect densities. This permits active buffer components 30 to be densely placed, minimizing interconnect lengths.

The coaxial transmission lines in the illustrated embodiment have dielectric spacer layers with a relatively low dielectric constant ($e_r=2.2$) to provide relatively long wavelengths, minimizing the effect of the spacing between discontinuities and the length of the stubs. However, even lower dielectric constant spacer (e.g., 1.5 or less) layers such as provided by low density foam polymers also having low dielectric loss at high frequency, may be used to improve performance and data bus length.

Laser-drilled holes with diameters down to 0.006" allow vias to be placed directly beneath pads. This reduces parasitic impedances associated with a trace connecting a via to a pad. In addition, surface attach components are accommodated, minimizing parasitics associated with leaded components. Surface attach fabrication techniques also allow dense component packing, minimizing interconnect lengths. Multilayer capability also allows entire planes for each power and ground, reducing noise on the power supplies.

While the illustrated embodiment utilizes small coaxial transmission lines embedded in the mother and daughterboards, it will be appreciated that other transmission lines such as conductor-over-ground plane or conductor-between-ground plane transmission lines may also be used.

As indicated, the use of a through-package transmission line design is an important feature of the high frequency data bus systems of the present invention. In this regard, the transmission line, at an impedance substantially the same as that of the motherboard transmission line, is conducted through the chip package to the active integrated circuit chip therein, and back out of the chip carrier along a separate continuation of the transmission line.

Figure 3:
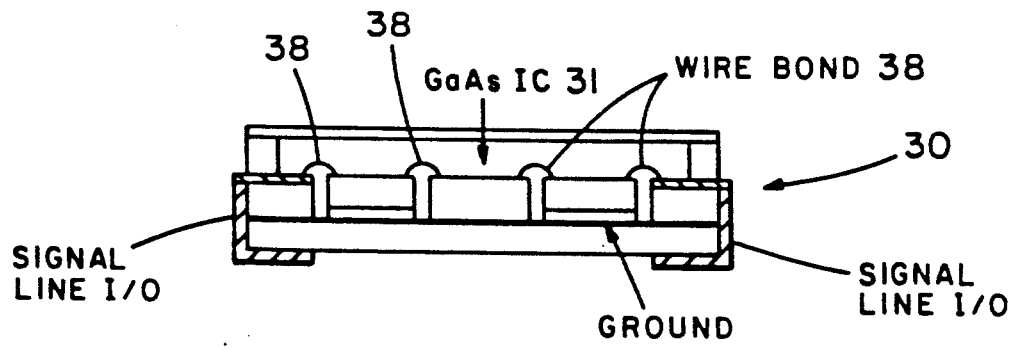
FIG. 3 is a cross sectional view of a high-speed gallium arsenide integrated circuit package having an in-and-out transmission line structure utilized as an active buffer in the backplane motherboard of the system of FIG. 1.
Figure 4:
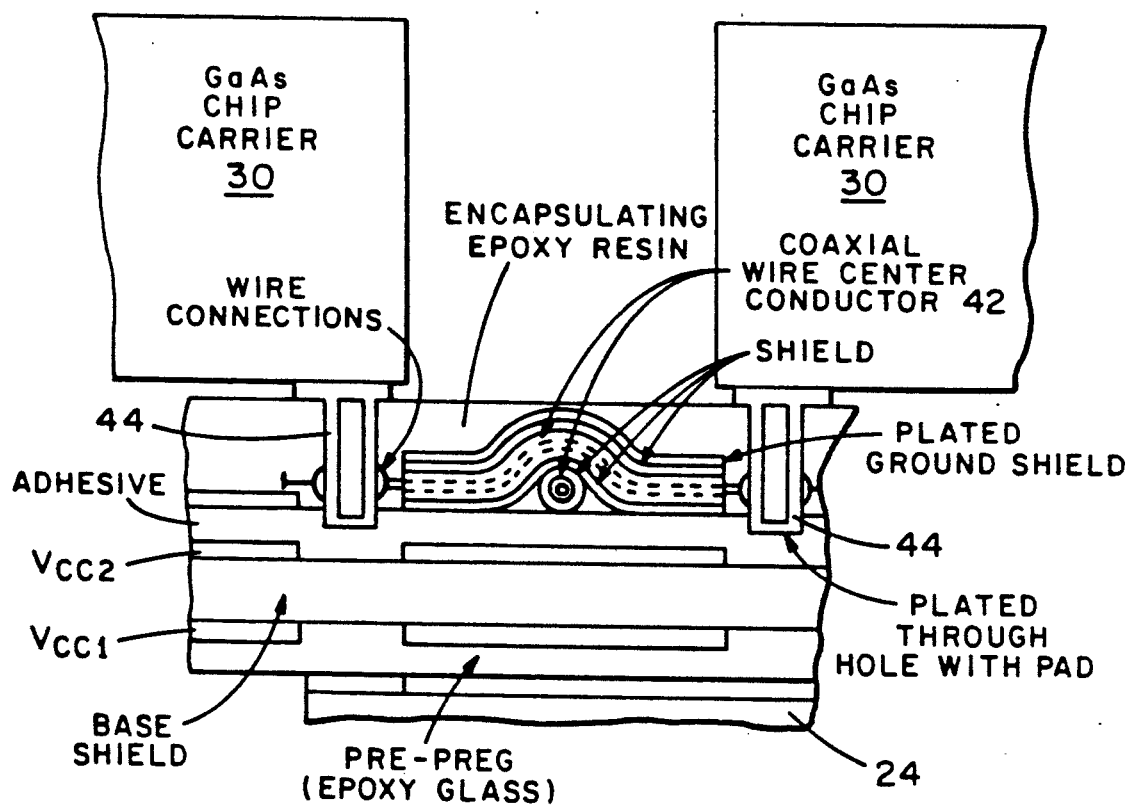
FIG. 4 is a cross sectional view of a portion of the motherboard of FIG. 1 illustrating its embedded coaxial cable structure and its interconnection with the in-and-out gallium arsenide chip packages of the backplane motherboard.

In a through-package transmission line as shown in FIGS. 3 and 6, the GaAs integrated circuit 31 is wire bonded to a ceramic connector insert having microstrip transmission line continuation components 34, 36 having the same characteristic impedance as the coaxial wire components of the differential transmission line, by wire bond connectors 38. The wire bond connections 38 should best be less than 800 microns in length. The coplanar strip lines 34, 36 of each transmission line are in turn similarly wire bonded to the I/O chip carrier connectors which are bump-soldered (FIG. 4) to plated through holes 44 which connect with coaxial wires 42. Other lines (not shown because in line with 44) from the carrier 30 communicate with the daughter-boards by plated through holes which pass through the motherboard 12 in a conventional manner.

Figure 24:
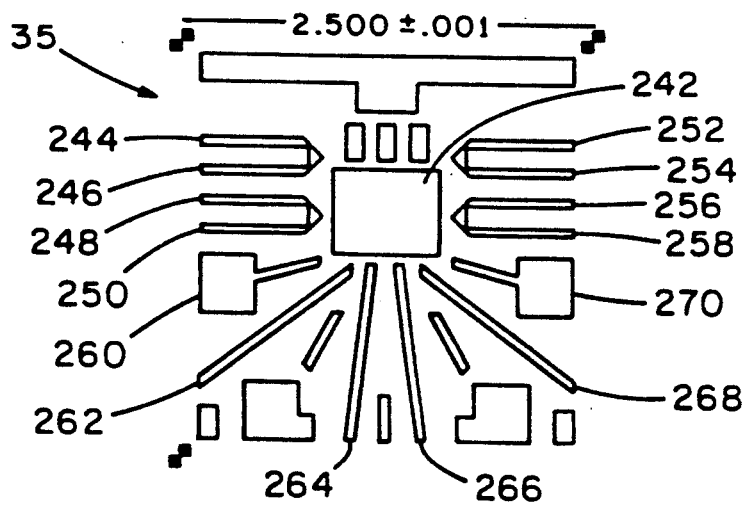
FIG. 24 is an alternative embodiment of in-and-out package lead insert like that of FIG. 6.

In the illustrated embodiment 30, a Gallium Arsenide [GigaBit 10G012A] Dual Complementary Driver/Comparator chip 31 is used as the active interface for the high-speed backplane of the motherboard 12, with a specially designed ceramic insert 35 to produce a through-package transmission line design. The chip 31 is bonded in the center of a ceramic insert 35 which acts as the substrate for several 50 ohm microstrip lines. Signal pads are bonded out from the chip 31 to the nearby microstrip lines (FIGS. 3, 6) which, in turn, bonds out to a package pin. This reduces the inductance that would be associated with a single bond wire stretching from the package pin to the die and provides a more continuous 50 ohm path from the board to the chip 31. Other direct bond connections may be utilized to eliminate wire bonds, and a plurality of IC chips may be included in a single package, mounted along the internal transmission lines. While the in-an-out transmission line system is schematically illustrated in FIG. 6, an enlarged, substantially scale drawing of the 2-bit integrated circuit ceramic connector insert 35 for the gigabit chip 31 is shown in FIG. 24, which is described in more detail hereinafter.

Figure 7A:
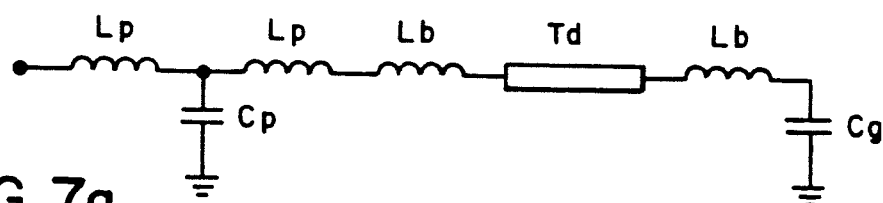
FIGS. 7a and 7b are schematic illustrations, respectively, of the circuit models for a standard gallium arsendie integrated circuit package, and the in-and-out (no-stub) package of FIG. 6.
Figure 7B:
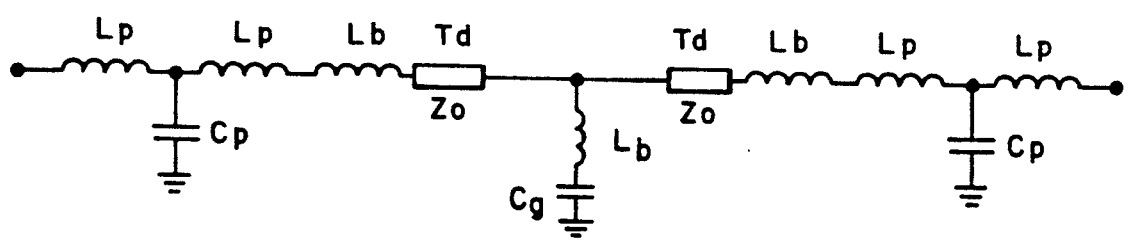

As indicated, the through-package design of the active data bus system 10 is an important aspect of its high performance characteristics. As demonstrated by circuit modeling utilizing SPICE circuit emulation software, conventional stub-packaged GaAs parts are unsuitable to high speed multi-tap systems such as shown in FIG. 1. In this configuration the 50 ohm stub at each tap is eliminated by entering the package on one pin, looping through the package on a single 50 ohm microstrip line and exiting the package on a second pin to continue on to the next tap. To analyze system performance in comparison to conventional stub designs, SPICE simulations were performed on the multitapped bus for the standard and custom packages at each tap for the package circuit models shown in FIGS. 7a and 7b. Lp and Cp represent the parasitic inductances and capacitance associated with a package pin. Lb represents the bond wire inductance, Cg the input capacitance of the die, and Td the time delay of the 50 ohm microstrip line. The component values are listed on FIG. 7b. These package models were then used in the data bus circuit models shown in FIGS. 8a and 8b.

Figure 8A:
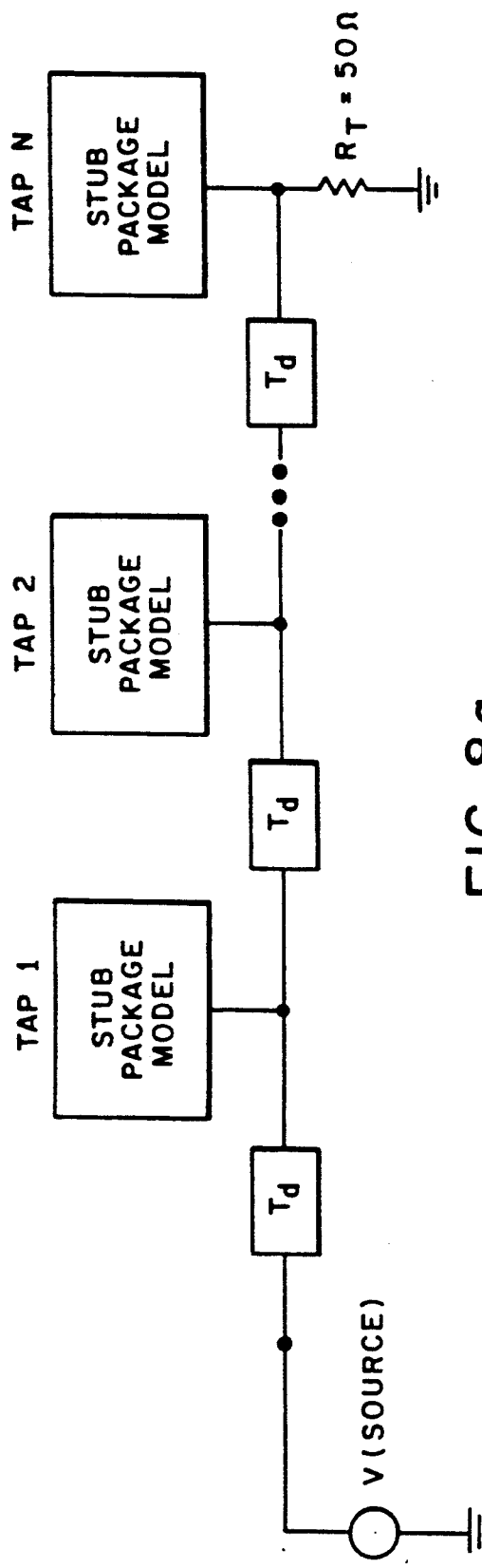
FIGS. 8a and 8b are, respectively circuit models for analysis of a data bus like that of FIG. 1, but using a conventional stub package, and the calculated transient response of a standard integrated circuit package having the circuit configuration of FIG. 7a, as compared to the calculated transient response for the in-and-out package having the circuit configuration of FIG. 7b.
Figure 8B:
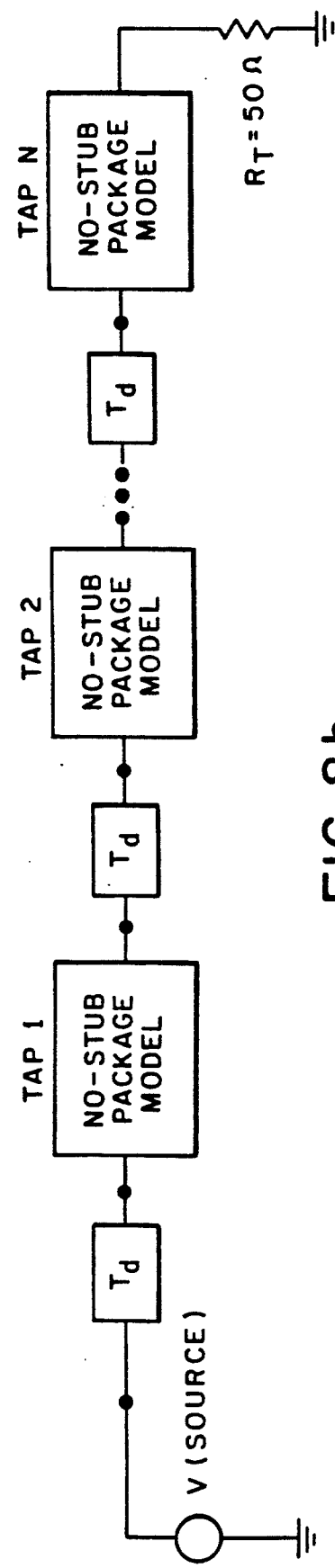
Figure 9:
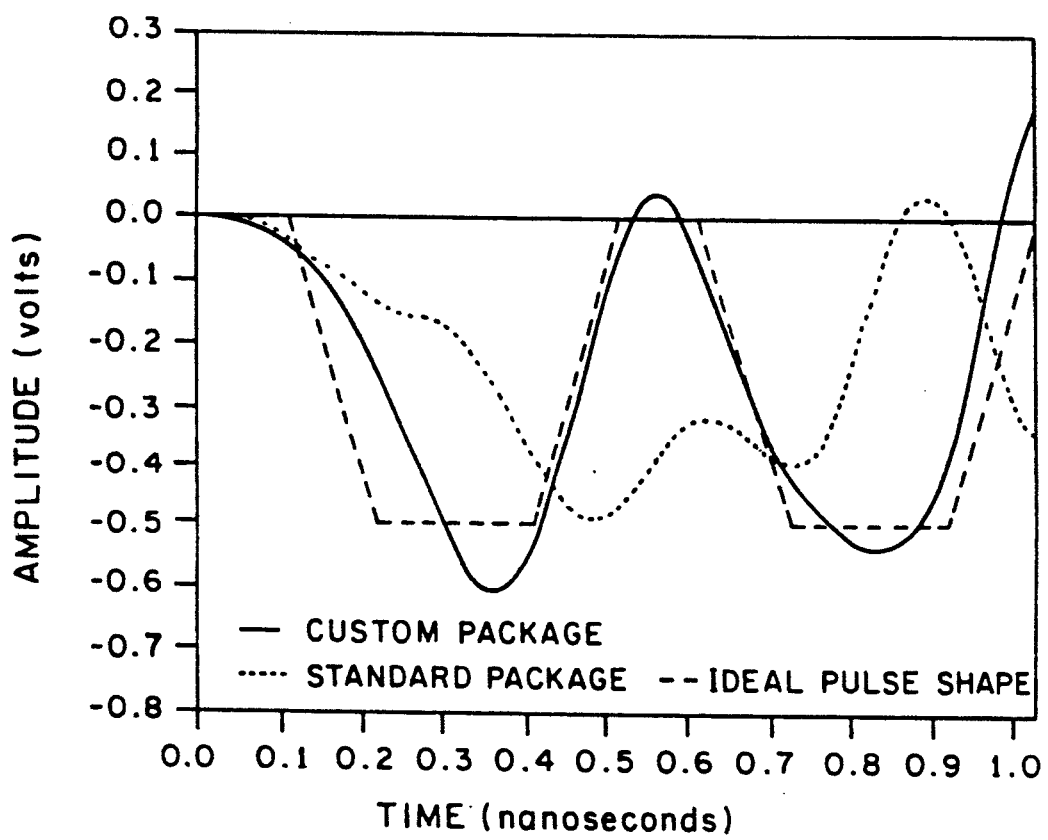
FIG. 9 is a graphic representation of the calculated transient response of a standard integrated circuit package having the circuit configuration of FIG. 7a, as compared to the calculated transient response for the in-and-out package having the circuit configuration of FIG. 7b.

FIG. 9 shows the results of the transient simulations at the seventh tap of the bus circuit models shown in FIGS. 8a and 8b. Using a standard (stub) GaAs package, the signal degradation at tap seven is so severe the input pulse train is unrecognizable. Using the model for the In-and-Out package, the results are shown to be greatly improved. The rounding of the pulse edges is due to the low-pass characteristics of the package model at each tap of the transmission line. The differential receivers at each tap serve to restore the pulse shape before the data is sent to the daughterboards.

Figure 10:
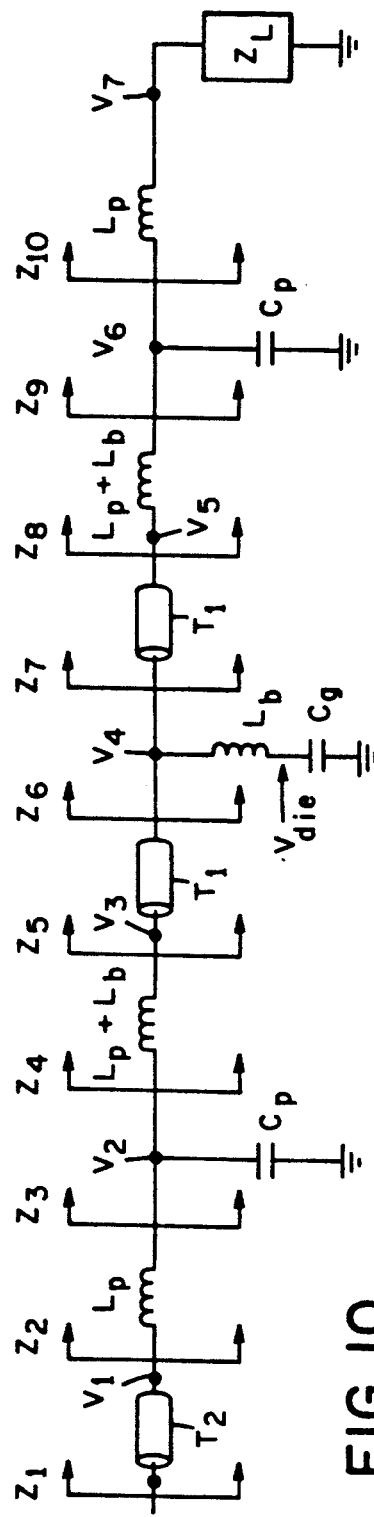
FIG. 10 is a schematic illustration of the circuit elements for analysis of a lossy transmission line data bus system having multiple taps.
Figure 12:
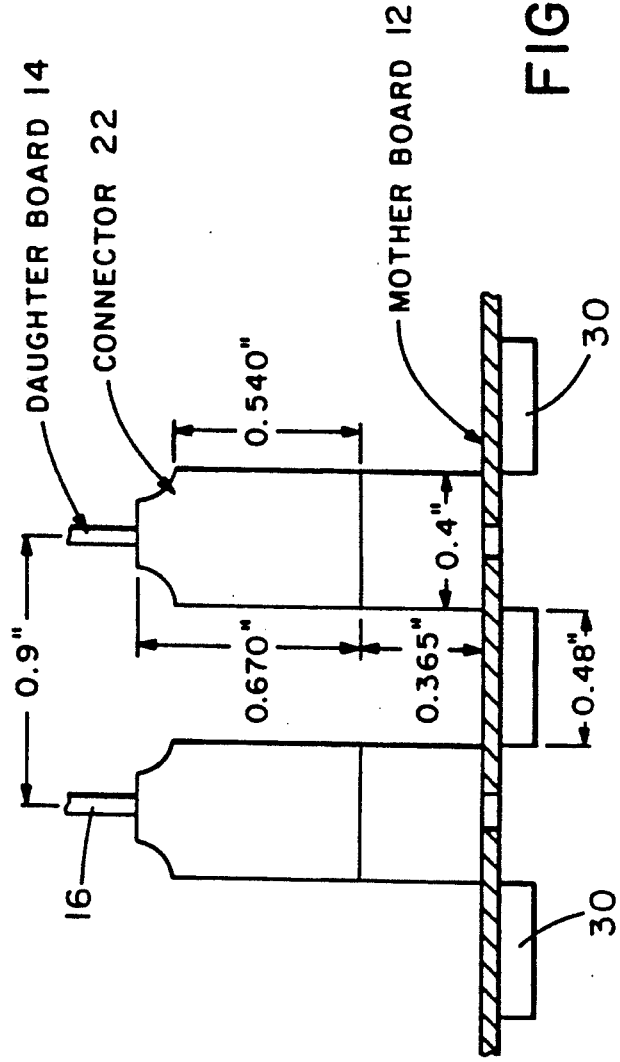
FIG. 12 is an illustration of the backplane component placement on the motherboard of the fast backplane used in test bed equipment.

A further analysis of the bus model using the in-and-out package was performed to include transmission-line losses, since SPICE does not include loss in its transmission line models. The in-and-out package was analyzed for circuit impedance components as shown in FIG. 10, to include the coaxial transmission line ($T_2$) that connects this tap to the previous tap on the motherboard 12. In this analysis, the equation for the input impedance of a lossy transmission line is given by $$Z_i = Z_o \frac{1 + \rho \exp[-2(\alpha + j\beta)l]}{1 - \rho \exp[-2(\alpha + j\beta)l]}$$

where
$Z_i$ = the transmission line input impedance
$Z_o$ = the characteristic impedance of the transmission line
$\alpha$ = the attenuation constant
$\beta$ = the phase constant
and $$\rho = \frac{Z_i - Z_o}{Z_i + Z_o}.$$

For a lossless transmission line, d=o. For a lossy case, $\alpha$ consists of skin-effect and dielectric loss factors. Skin-effect loss results from the fact that, at high frequencies, current is concentrated near the surface of a conductor.

This reduces the cross sectional area of the conductor through which the current is flowing, effectively increasing the conductor's resistance. Dielectric loss is due to the energy required to maintain propagation in an imperfect dielectric. These losses can be determined from the following equations.

For coax, the skin-effect loss is given by $$\alpha_s = \frac{1}{2Z_o} \sqrt{\frac{f\mu_r\mu_o}{\pi\sigma}} \left( \frac{1}{o.d.} + \frac{1}{i.d.} \right),$$

and the dielectric loss is given by $$\alpha_d = \frac{\psi \pi f}{v_p},$$

where $Z_o$ = the characteristic impedance of the transmission line
$f$ = frequency
$\mu^o$ = the permeability constant
$\mu^r$ = the relative permeability of the center conductor
$\sigma$ = the conductivity of the center conductor
o.d. = the outer diameter of the coax
i.d. = the diameter of the inner conductor
$\psi$ = the coax loss tangent and
$v_p$ = the velocity of propagation in the dielectric For microstrip, the skin-effect loss is given by $$\alpha_s = \frac{R_s}{2\pi Z_o h} \left[ 1 - \left( \frac{w'}{4h} \right)^2 \right] \left[ 1 + \frac{h}{w'} - \frac{h}{w'} \left( \frac{t}{h} - \ln\frac{2h}{t} \right) \right]$$

where $Z_o$ = the characteristic impedance of the microstrip line
$\omega' = \omega + \Delta\omega$
$\omega$ = the width of the microstrip $$\Delta w = \frac{t}{\pi} \left( 1 + \ln\frac{2h}{t} \right)$$

h = the substrate thickness
t = the thickness of the conductor $$R_s = \sqrt{\frac{\mu f \mu_o}{\sigma}}$$

f = frequency
$\mu_o$ = the permeability constant (The dielectric loss in microstrip is negligible for alumina substrates as used in the ceramic insert of packages 30.)

The total loss utilized in the analysis is the sum of the skin-effect and dielectric losses for each structure. These equations defining lossy transmission lines may be utilized to analyze the performance of the in-and-out package in the fast backplane data bus system of FIG. 1. The propagation velocities, the skin-effect and dielectric losses as described hereinabove, the physical lengths of the microstrip and the coaxial lines, the number of taps and termination impedances for the multi-tapped bus utilized in the analyzers together with the amplitude, time delay, rise and fall times and pulse width of the input pulse to the multi-tapped line, are utilized with Fast Fourier Transform (FFT) analysis to calculate the input pulse. Impedances along the transmission line are calculated, starting with the last tap moving toward the first. At each tap, $Z_{10}$ (see FIG. 10) is solved first. $Z_{10}$ is then used to solve for $Z_9$ and so on, back to $Z_1$. $Z_L$ for the last tap is the transmission line terminating impedance. For all other taps, $Z_L$ is $Z_1$ of the following tap. A steady-state output is then calculated at the die of each tap for each component of the input pulse. Once all frequency components of the input pulse have been applied to the bus, inverse FFT's are performed on the output components of each tap to provide the pulse shape at the die of each tap on the bus.

Figure 11:
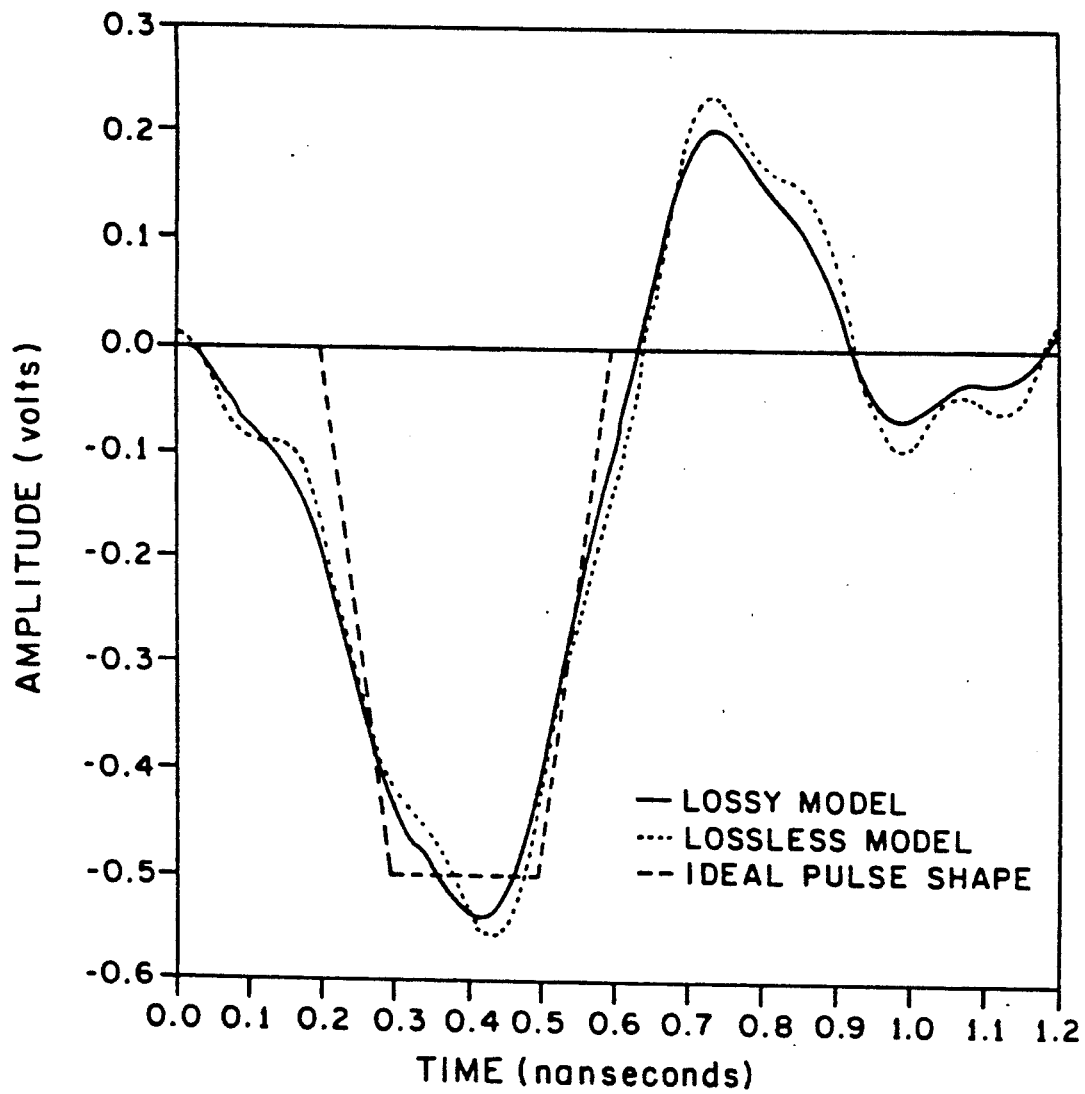
FIG. 11 is a graphic representation of the calculated response of the lossy transmission line data bus system having circuit elements as shown in FIG. 10 in comparison with a corresponding but lossless system, and in comparison with the ideal pulse shape.
Figure 13:
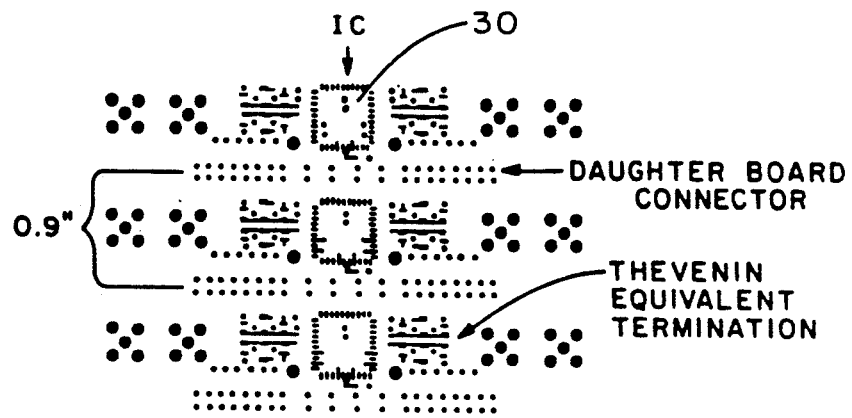
FIG. 13 is a component side view of a section of the motherboard of the fast backplane system of FIG. 1.
Figure 14:
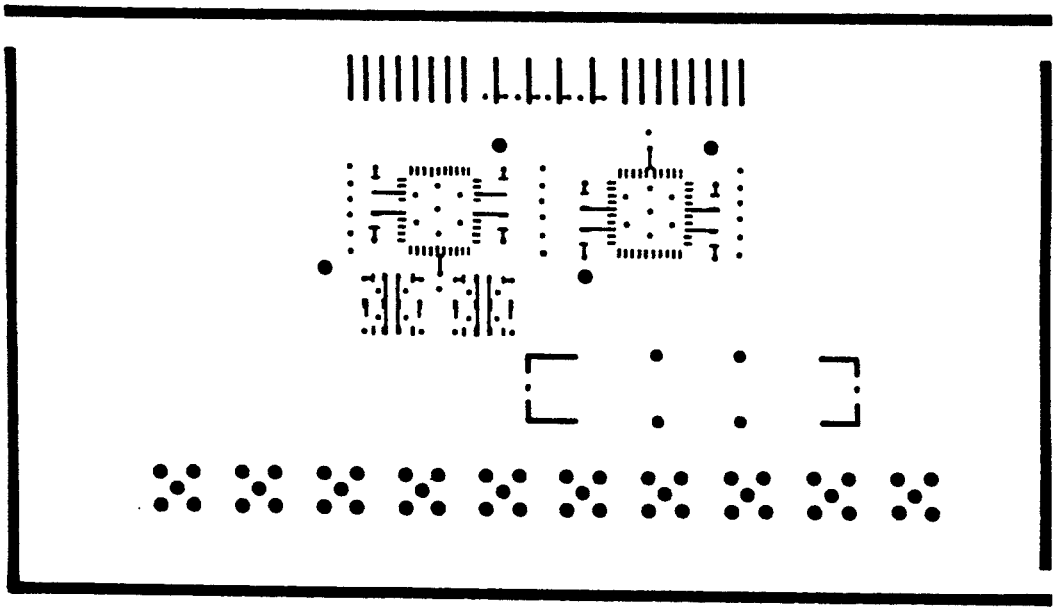
FIG. 14 is a component side view of a daughterboard of the fast backplane system of FIG. 1.
Figure 15A:
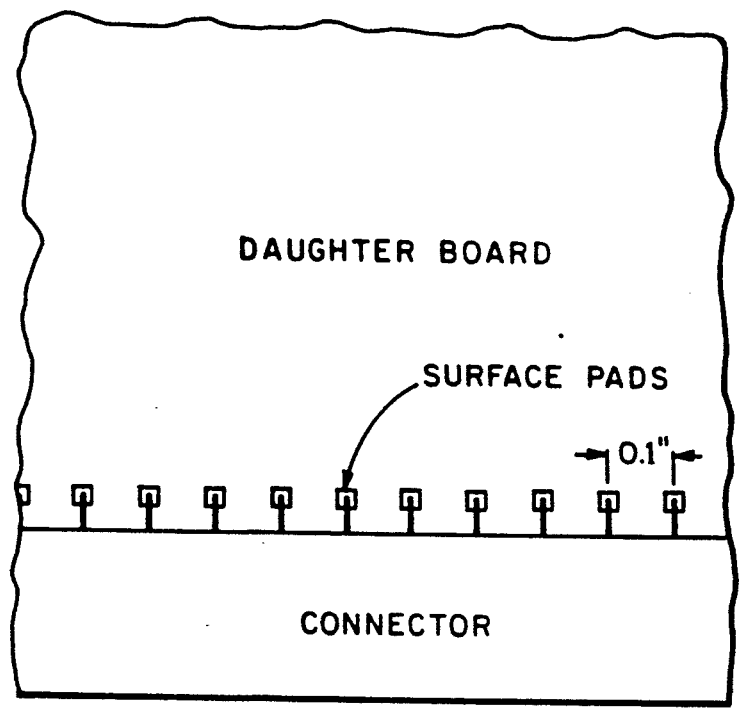
FIG. 15a is a top view of the daughterboard/connector interface of the fast backplane system of FIG. 1
Figure 15B:
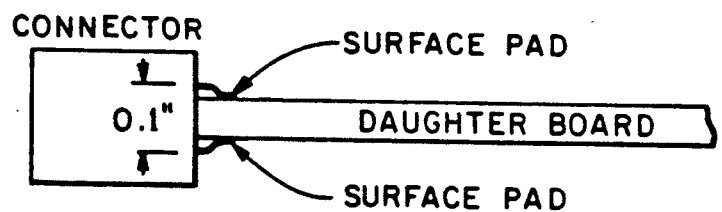

Using the skin-effect and dielectric loss equations as previously defined, the loss factors were calculated to be $$7.98 \times 10^{-4} f + 11.24 \times 10^{-3}/f \text{ (inch)}^{-1}$$

for the Multiwire coax segments in the motherboard, and $$3.91 \times 10^{-7}/f \text{ (inch)}^{-1}$$

for the microstrip internal transmission line on the ceramic inserts of the packaged IC units 30. In both of the above equations, f is assumed to be in GHz. The bus was then simulated using the lossy transmission line software for the loss factors equal to zero and then including the loss calculated above. The results of this simulation are shown in FIG. 11 for the last tap of a 7-tap line.

With loss, there is less than 0.1 dB or 1.8% of attenuation over the lossless case at the pulse peak. The Figure also shows the development of unwanted transients on the bus. For a 7-tap bus, the transients are large enough that they may result in data errors on the bus. The illustrated high-speed bus accordingly is calculated to have a performance limitation of 2 GHz for lengths greater than about 7 taps.

Although direct interconnection of the transmission line through the receiver and/or driver circuits of the gallium arsenide integrated circuit chip as shown in FIG. 6 may be carried out by wire bonding each of the input and output transmission line ends, respectively, of the ceramic chip carrier insert, to the integrated circuit, it may be desirable for manufacturing yield, and integrated circuit design purposes to bring the transmission line as close as possible to the integrated circuit on the chip carrier, and make a single connection to the integrated circuit as shown in FIG. 24. Also, as indicated previously, multiple chips may be mounted along an internal transmission line in a single package if desired. The chip carrier design of FIG. 24 is shown substantially to scale, and is designed to minimize impedance variations as a result of the connection of the transmission line to the gallium arsenide integrated circuit 242. The illustrated chip carrier is a 2-bit design having two differential pair transmission line components. One transmission line component pair comprises line input 244 and line output 246, which with line input 248 and line output 250, comprises one differential transmission line pair. Another transmission line pair similarly comprises substantially identical microstrip over ground plane line input 252 and line output 254 (which may be of a suitable conductor such as gold) of one transmission line and line input 256 and line output 258 of the other transmission line of the second transmission line pair. Chip output lines 260, 262, 264, 266, 268 and other conventional chip connections, which ultimately connect to the daughter-boards through the motherboard as previously described, may be made in accordance with conventional practice. It is noted that the corners of the transmission line components 244-258 are chamfered to reduce discontinuities and signal distortion. The wire bond lengths are desirably between 500 and 700 microns in length. The illustrated transmission line microstrip characteristic impedance is approximately 50 Ohms, with a dielectric thickness of 10 mils, a microstrip line width of 8.3 mils, a relative dielectric constant of the ceramic substrate of 9.0, and an effective relative dielectric constant of 6.58 taking into account that the wave propagation is partially in air and partially in the ceramic substrate. The illustrated design has a low level of crosstalk, with a maximum crosstalk of about 1% for nearby lines.

Figure 16:
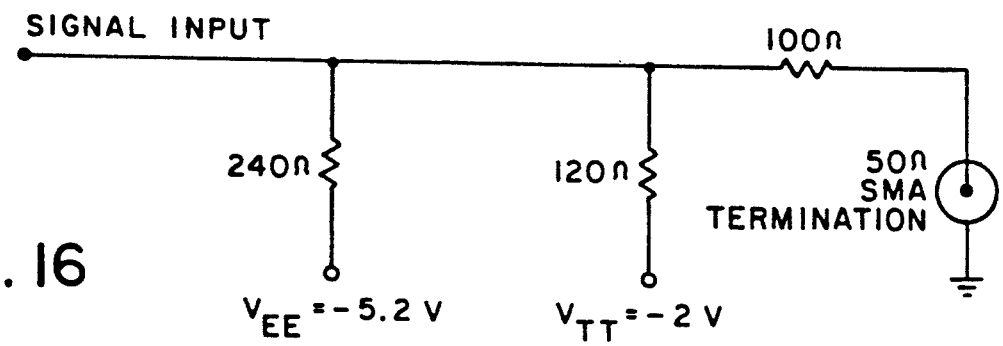
FIG. 16 is a circuit schematic of a Thevenin equivalent GaAs termination used in operation of the fast backplane system of FIG. 1.
Figure 17:
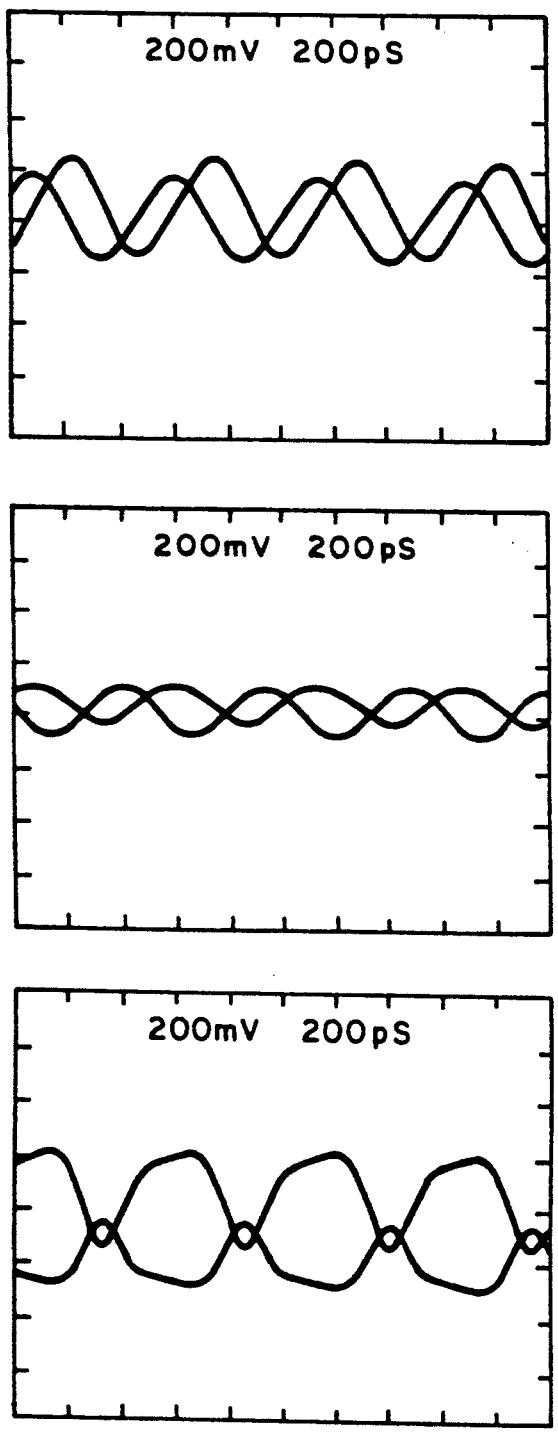
FIG. 17 is an illustration of 4-tap bus signals at 1.9 GHz operating frequency.
Figure 18:
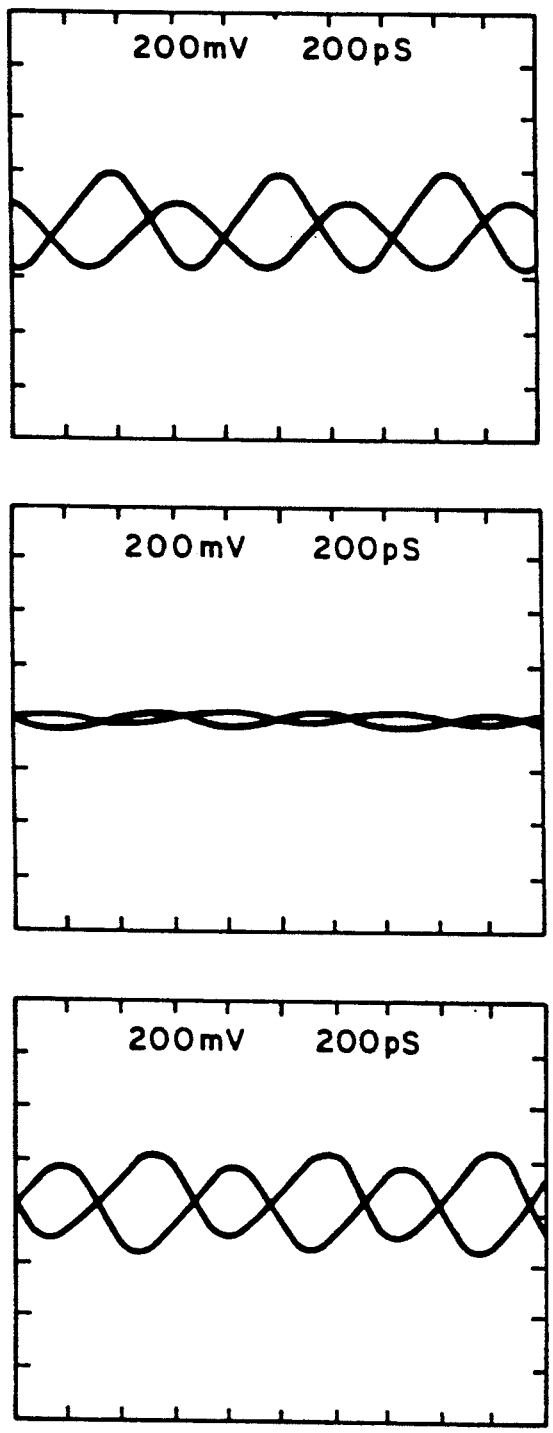
FIG. 18 is an illustration of 5-tap bus signals at 1.9 GHz maximum operating frequency of the system of FIG. 1.
Figure 19:
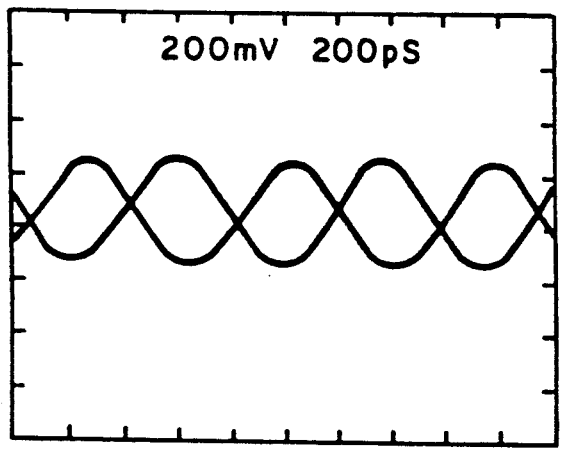
FIG. 19 is an illustration of 6-tap bus signals at 1.3 GHz maximum operating frequency of the system of FIG. 1.
Figure 19:
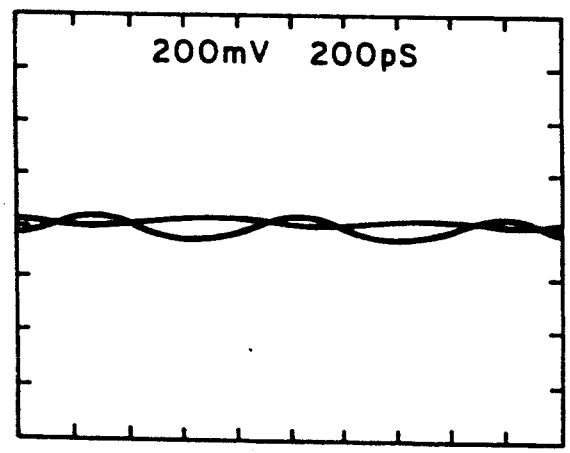
Figure 19:
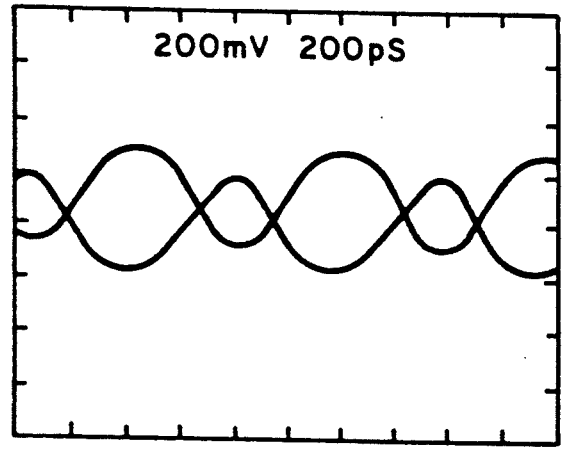
Figure 20:
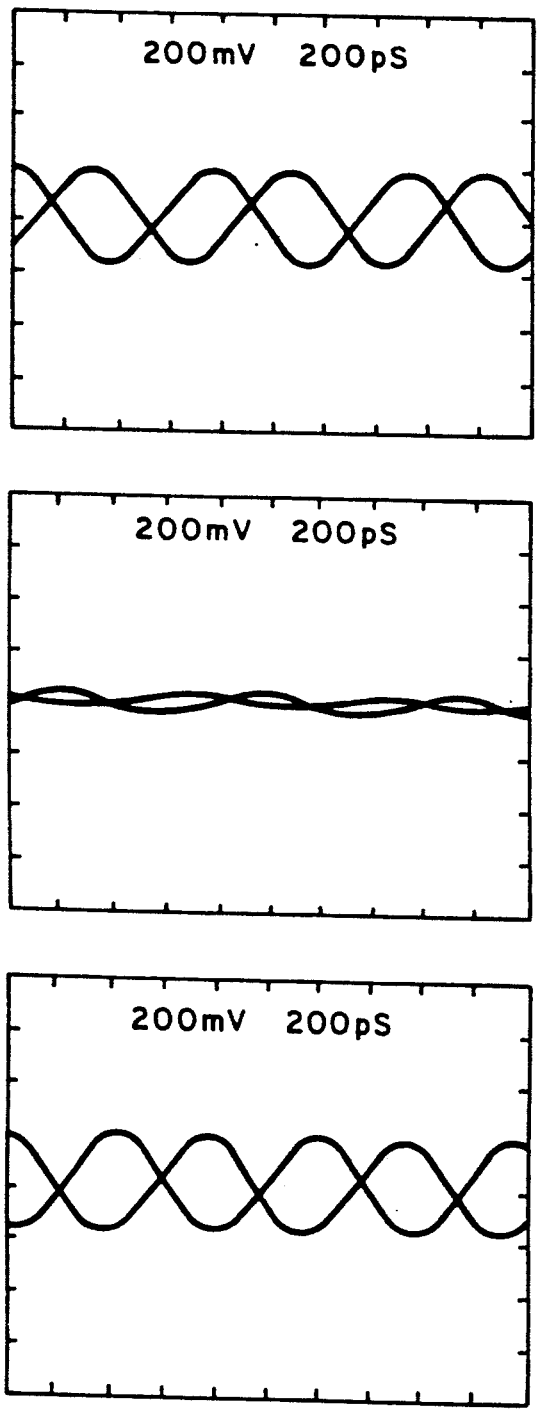
FIG. 20 is an illustration of 7-tap bus signals at 1.3 GHz maximum operating frequency of the system of FIG. 1.

Having discussed circuit analysis of the in-and-out transmission line design, performance data for an embodiment of the fast backplane system of FIG. 1 will now be described in which the signals at the output of the driver daughterboard, at the end of the bus, and at the output of the receiver daughterboard were observed. The tests were initially performed with the driver tap and a single receiver tap populated on the motherboard 12. After each of the two tests were performed, the next tap was populated, and the tests were repeated. The signals were observed by means of Theychin equivalent terminations (see FIG. 16) provided at the observation points mentioned above. The Thevenin equivalent sampling terminations add about 9.3 dB of attenuation to the observed signal.

Figure 21:
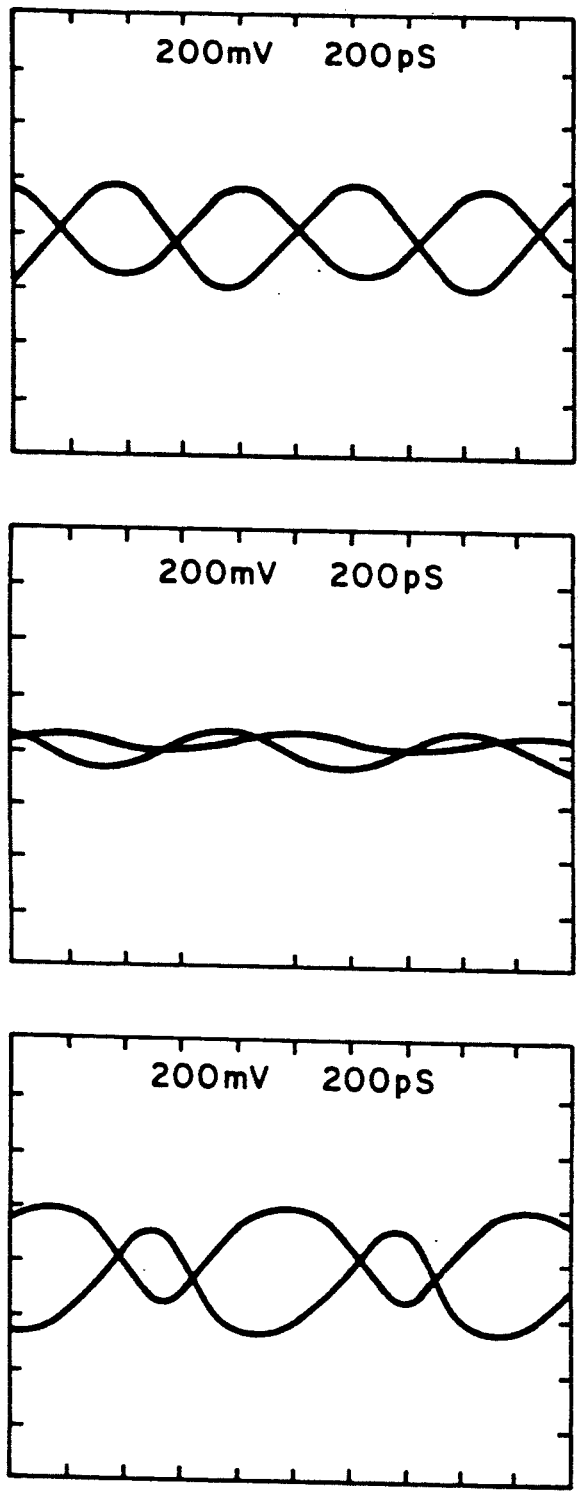
FIG. 21 is an illustration of 14-tap bus signals at 1.17GHz maximum operating frequency of the system of FIG. 1.
Figure 27:
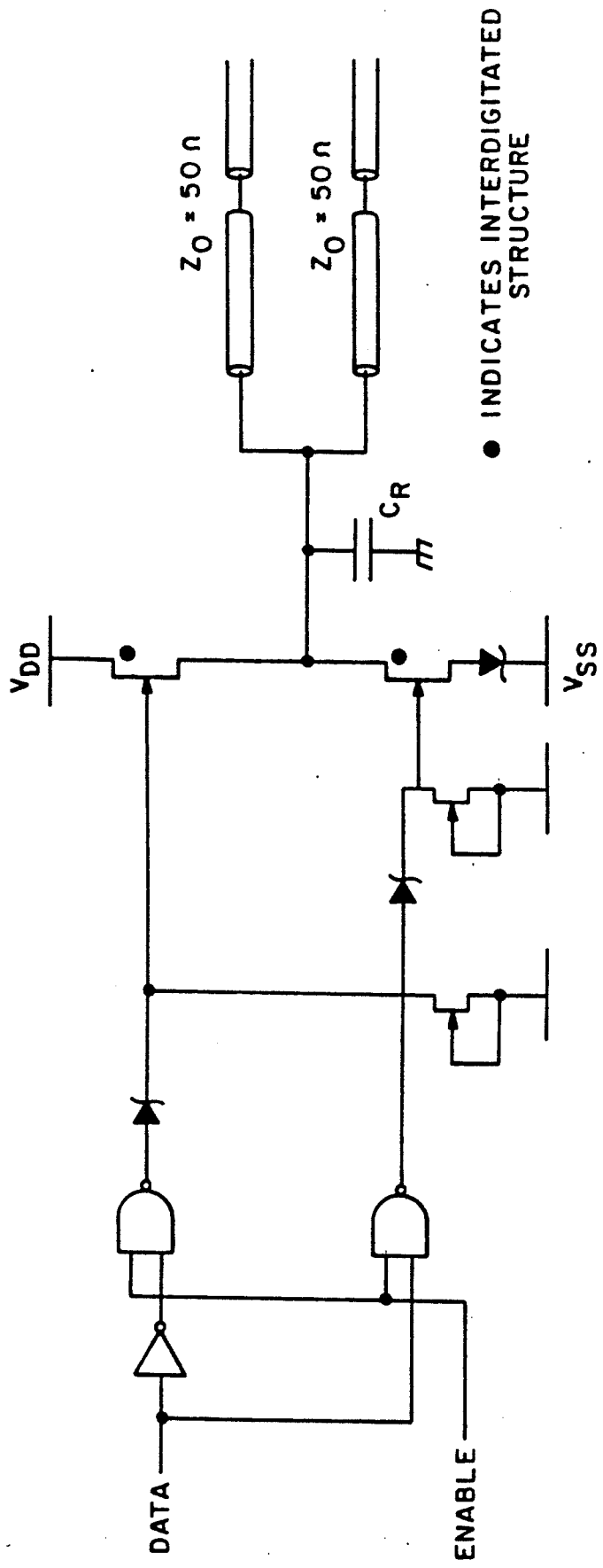
FIG. 27 is an integrated circuit schematic for a depletion mode gallium arsenide tristate output circuit for use with the integrated circuit chip of the tristate line driver system of FIG. 25.
Figure 28B:
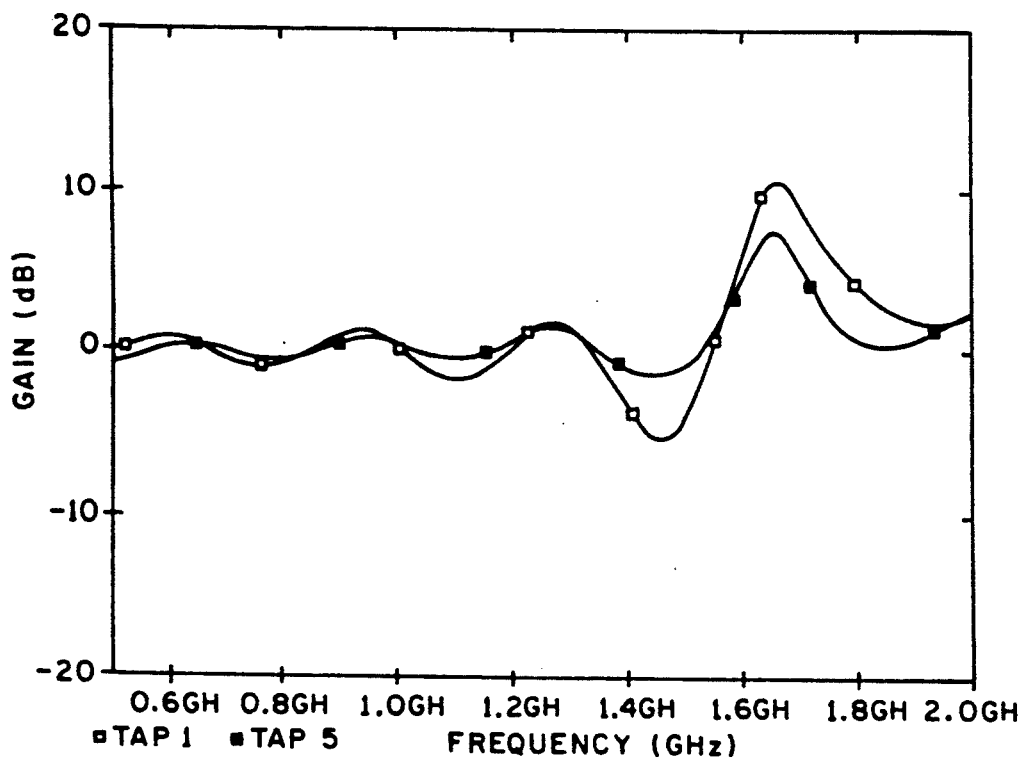
Figure 28B:
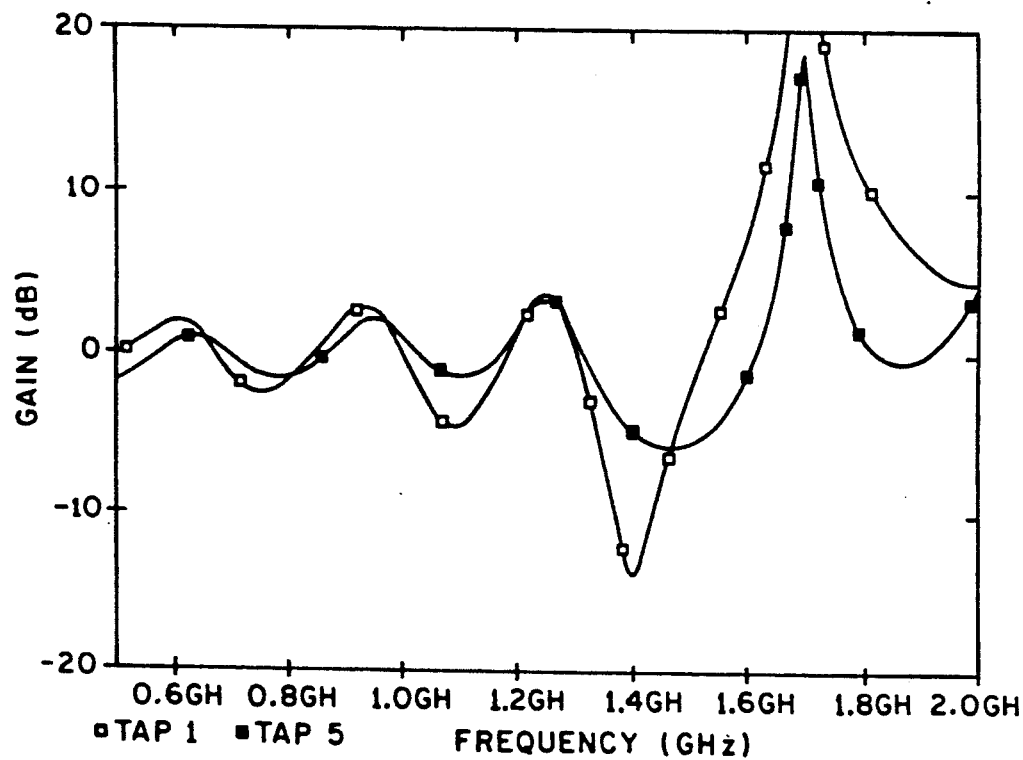
Figure 29B:
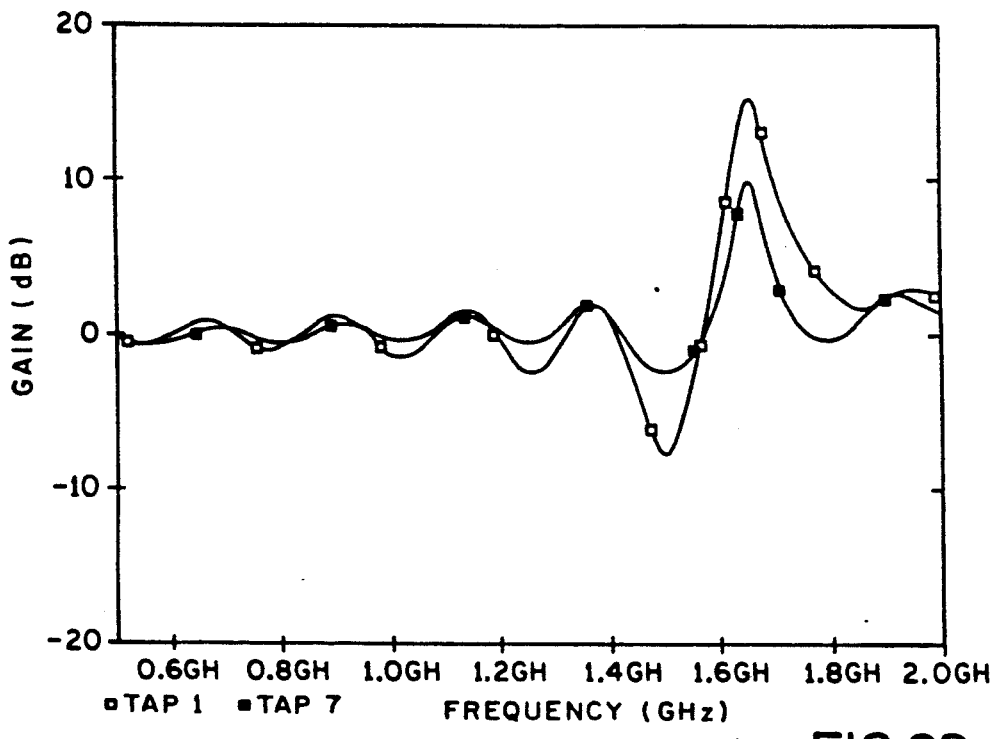
Figure 29B:
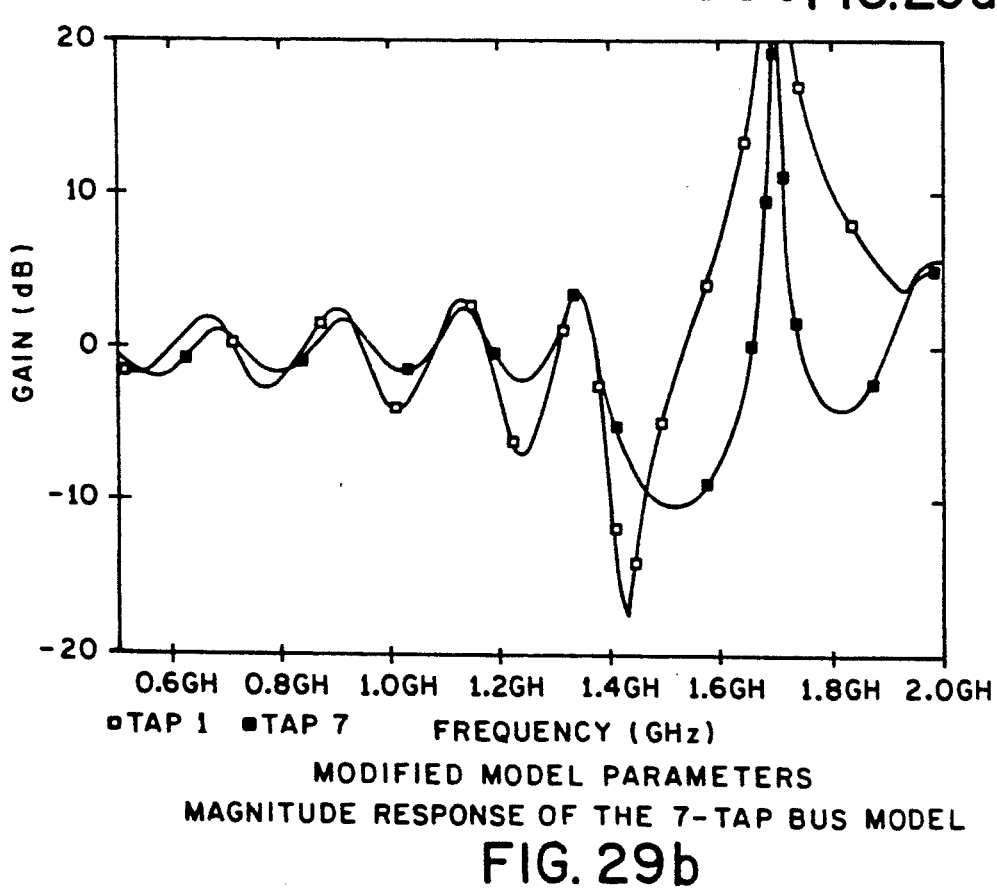
Figure 30B:
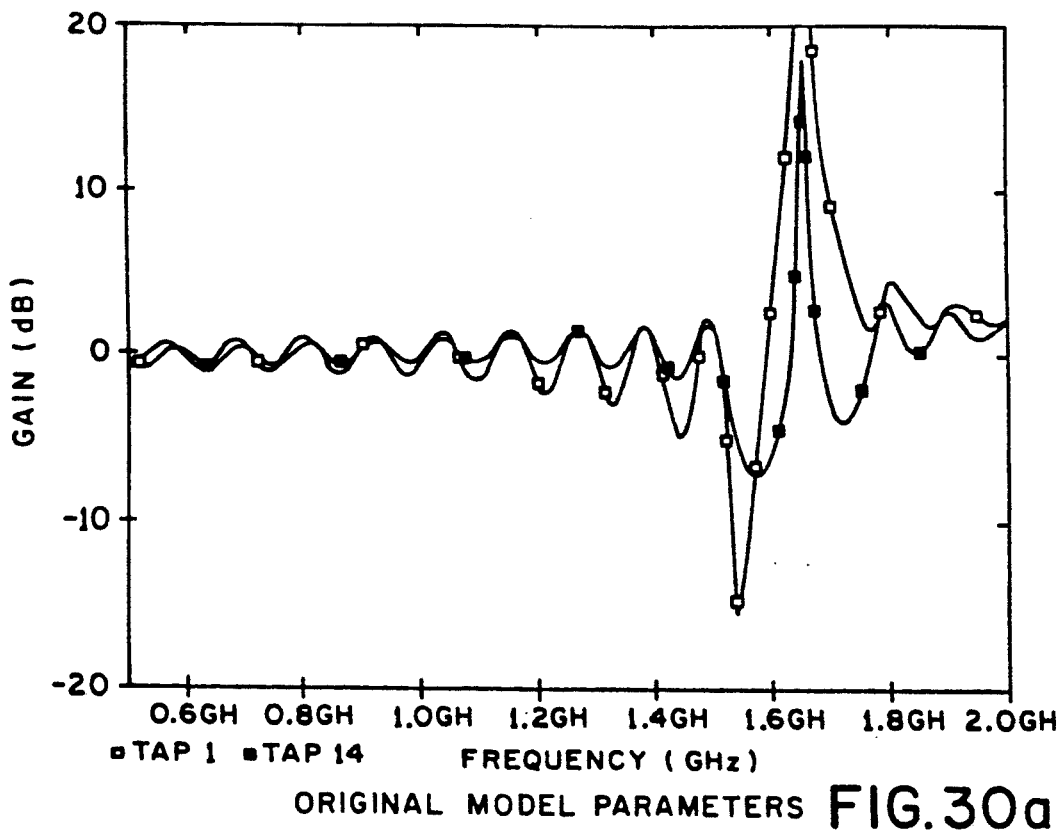
Figure 30B:
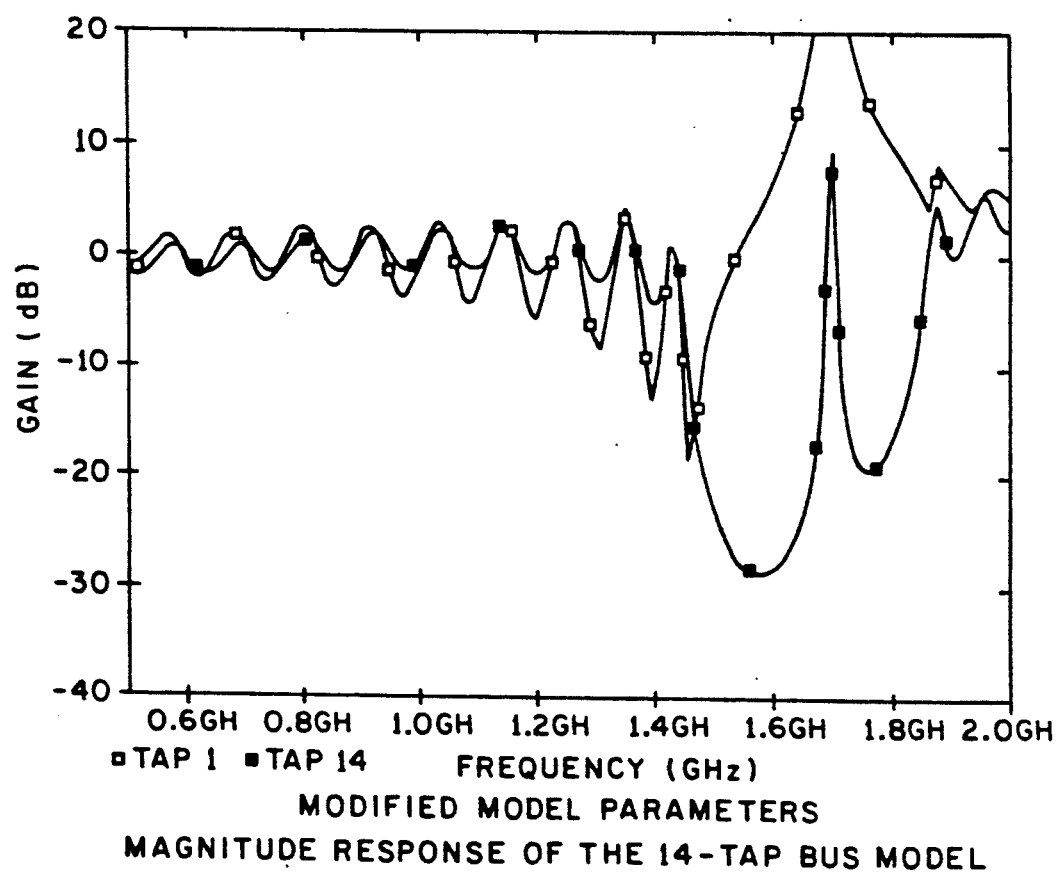

The first test was performed to determine the bandwidth of the fast backplane test bed as a function of the length (number of taps) of the bus. Each time a tap was populated, the input signal to the driver daughterboards was swept in frequency while observing the output of a receiver daughterboard placed at the last tap of the bus. The graphs of FIGS. 17 through 21 show the signal at various points on the bus at a frequency just prior to the disappearance of the daughterboard output for 4, 5, 6, 7 and 14 taps, respectively. This test showed the maximum bus length for reliable transmission at 1.9 GHz to be 5 taps for the illustrated system 10. For 6 and 7 taps, the maximum operating frequency is about 1.3 GHz and at 14 taps about 1.2 GHz. These graphs also illustrate the effect of the gain provided by the active interfaces at each tap. The second graph in each of FIGS. 27 through 21 shows the signal amplitude on the bus to be down by about 15 dB before the signal disappears at the output of the daughterboard.

Figure 22:
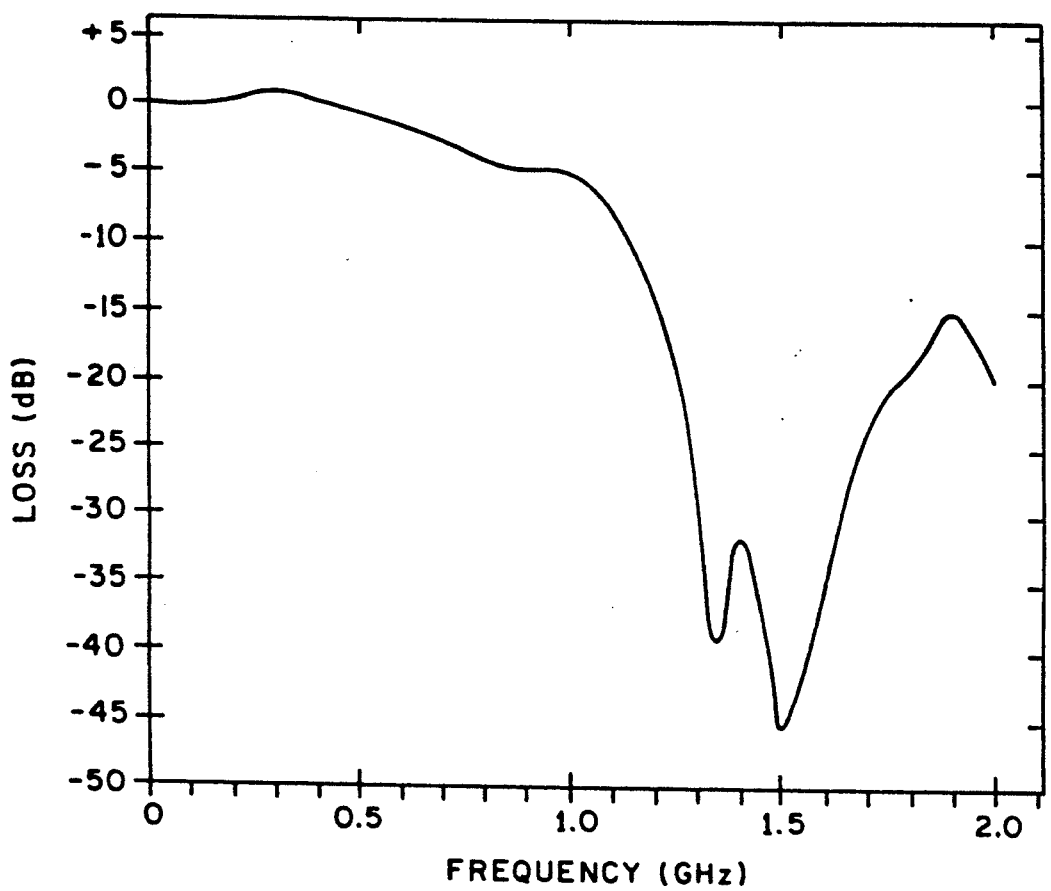
FIG. 22 is an illustration of measured magnitude response of the 14-tap bus of the system of FIG. 1.
Figure 23:
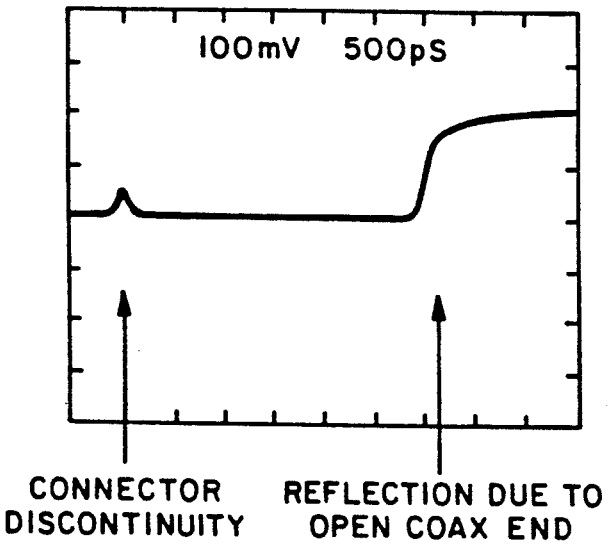
FIG. 23 is a TDR measurement of a one foot length of the external coax used for the external transmission line segments of the data bus of FIG. 1.

FIG. 22 is a plot of the magnitude response of the bus when populated to 14 taps. This plot was generated by observing the end of the bus (using the terminating Thevenin) while sweeping the input signal to the driver daughterboard. This plot shows the amplitude to be down 3 dB at about 700 MHz and 15 dB at about 1.2 GHz. The maximum attenuation occurs at about 1.5 GHz. The plots at the top of FIGS. 28(a), 28(b), 29(a), 29(b), 30(a) and 30(b) show the magnitude response results of ac SPICE simulations of 5-, 7-, and 14-tap bus as previously described with the addition of delay of the microstrip lines on the ceramic insert, which was calculated to be about 7.5 picoseconds. These simulations were performed using the substantially stubless, distributed multi-tap In-and-Out circuit model discussed hereinabove. All of the parameters of this model are the same as previously described except for the delay of the microstrip lines on the ceramic insert. After the custom inserts were constructed, this delay was calculated to be about 7.5 ps as opposed to 50 ps originally indicated by GigaBit. As shown in FIG. 23, the delay of the coax line was calculated to be very close to that measured using a time-domain reflectometer (TDR). All of these simulations show a null occurring at about 1.5 GHz, but the attenuation is much less than that indicated by the plot of FIG. 22.

A second indication of the test-bed performance was obtained by performing bit error rate tests. This test is performed by applying a pseudorandom bit pattern to the system input and then comparing the system output to an appropriately delayed version of the system input. Each time the output data does not match the input data, an error is counted. The bit error rate is then the percent of errors for a given number of input bits. Bit error testing was performed on the test bed using the Tau-Tron STX-1101 bit error rate transmitter and SRX-1101 bit error rate receiver. The Tau-Tron test set is capable of testing at clock rates from about 90 MHz to 1.1 GHz.

Figure 31:
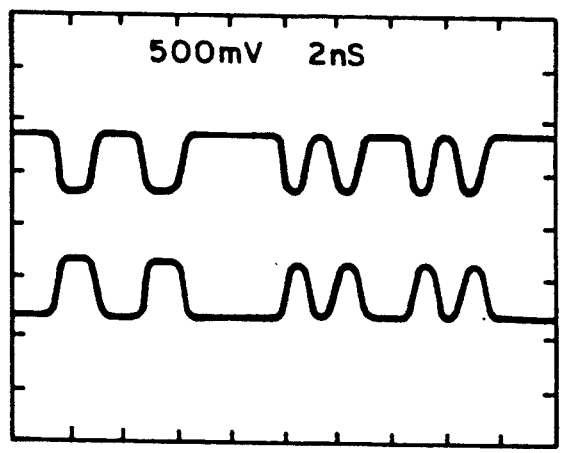
FIG. 31 is a graphical representation of 4-tap bus signals for a data pattern at a 1.1 GHz clock signal of the system of FIG. 1.
Figure 31:
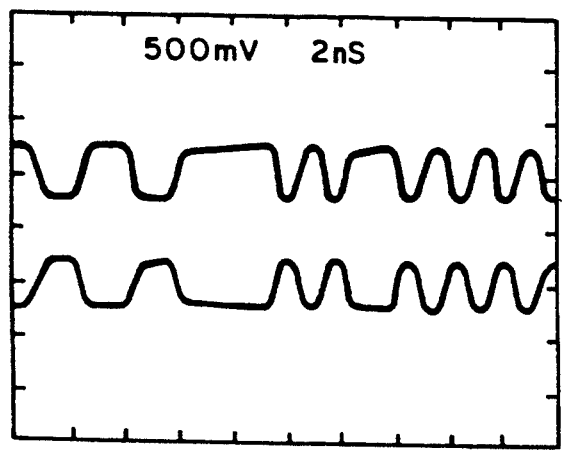
Figure 31:
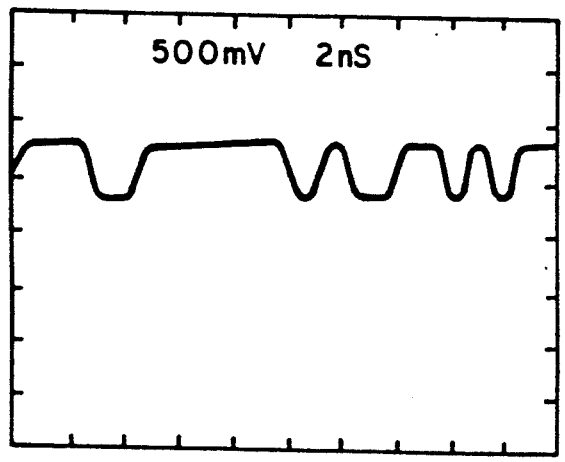

FIG. 31 shows the 1.1 GHz data pattern at various points of the bus when populated to 4 taps. At 1.1 GHz, zero errors were counted after at least 30 minutes of testing, corresponding to an error rate of less than $1 \times 10^{-12}$ for all taps except Tap 14. Tap 14 had an open circuit in one of the coax connections that connected an output to the motherboard/daughterboard connector. This was repaired by running a coax line on top of the PC board. The open-circuited coax then appeared as a stub on the line since it was still connected at either the IC or the connector. As a result, this tap could not run with zero errors above about 900 MHz.

Testing of a single transmission line embodiment like that illustrated in FIG. 1 of a high-speed test bed constructed under this program indicated bandwidths of up to 1.9 GHz for bus lengths of five taps or less, and up to 1.2 GHz for bus lengths up to 14 taps for the tested embodiment. Bit Error Rate Testing (BERT) proved the bus capable of operating at error rates of less than $10^{-12}$ at 1.1 GHz for lengths of up to 13 taps. It is likely that this error rate could have been achieved at tap 14 had a repair to the motherboard not been necessary. The error rate tests were performed at 1.1 GHz because this was the fastest data rate available in readily available BERT equipment. The testing also showed bus operation as being independent of the number and position of the daughterboards placed on the bus. This independence was a result of placing active interfaces at the taps, providing a constant load on the bus.

This program also resulted in the development of models that can be used to predict with reasonable accuracy the performance of the bus. These models included the effects of lossy transmission lines and the capacitances and inductances associated with package pins, vias, and package bond wires.

A related result of more general interest is also worth noting. The same techniques used to achieve over 1 GHz clock rates on backplanes apply to general packaging of the digital GaAs parts. Fast, GaAs circuitry relies heavily on synchronization with a master clock. Typically, at rates of 1 GHz, fan out is limited to only two clock ports, thus requiring excessive buffering. The techniques developed under this program could permit a fan out of 14, thus dramatically reducing parts count and power dissipation. Additional information is included in the attached Appendix A "Design and Evaluation of a High-Speed (>500 MHz) Back Plane".

The effective coax length may be reduced by reducing physical and electrical lengths of the tap interconnects, to increase performance, as previously described. In addition to reducing the physical length between the interconnect devices, the electrical lengths may be reduced by choosing a dielectric for the coaxial with a lower dielectric constant. For example, a dielectric with $e_r=1.3$ may be provided, which is less than that used in the test bed, to decrease the electrical length of the coaxial interconnect. The backplane may also be constructed of microstrip or another method interconnecting transmission lines to connect the bus taps, using low dielectric constant materials to maintain short electrical lengths between bus taps, while minimizing crosstalk between lines, and minimizing the need for or adverse effects of crossovers.

While the GaAs devices 30 utilized in the previously described tests are adapted to receive the signals transmitted along the data bus, and to retransmit them to the respective daughterboards, active devices capable of both receiving and transmitting digital signals along the data bus may also be provided. In this regard, active GaAs devices 30 may be provided with tri-state outputs to permit low impedance connection of (inactive) transmitters along the data bus. The capability of both transmitting and receiving information from multiple points along the bus facilitater the design of highly concurrent (pipelined) structures, allows "handshake" capability for cleaner system designs, allows multiple processor boards in complex systems and allows for multiple memory board structures. A tri-state GaAs driver may be a D-mode (depletion mode) driver or an E/D mode (enhancement and depletion mode) driver circuit shown in FIGS. 27, and 26 respectively. The E/D mode circuit offers the advantages of a better circuit noise margin, lower static power dissipation, and higher gain at each stage, allowing FET sizes to be reduced. This reduction in the size of the FET's results in nearly one half the output capacitance of the D-mode process.

Figure 26:
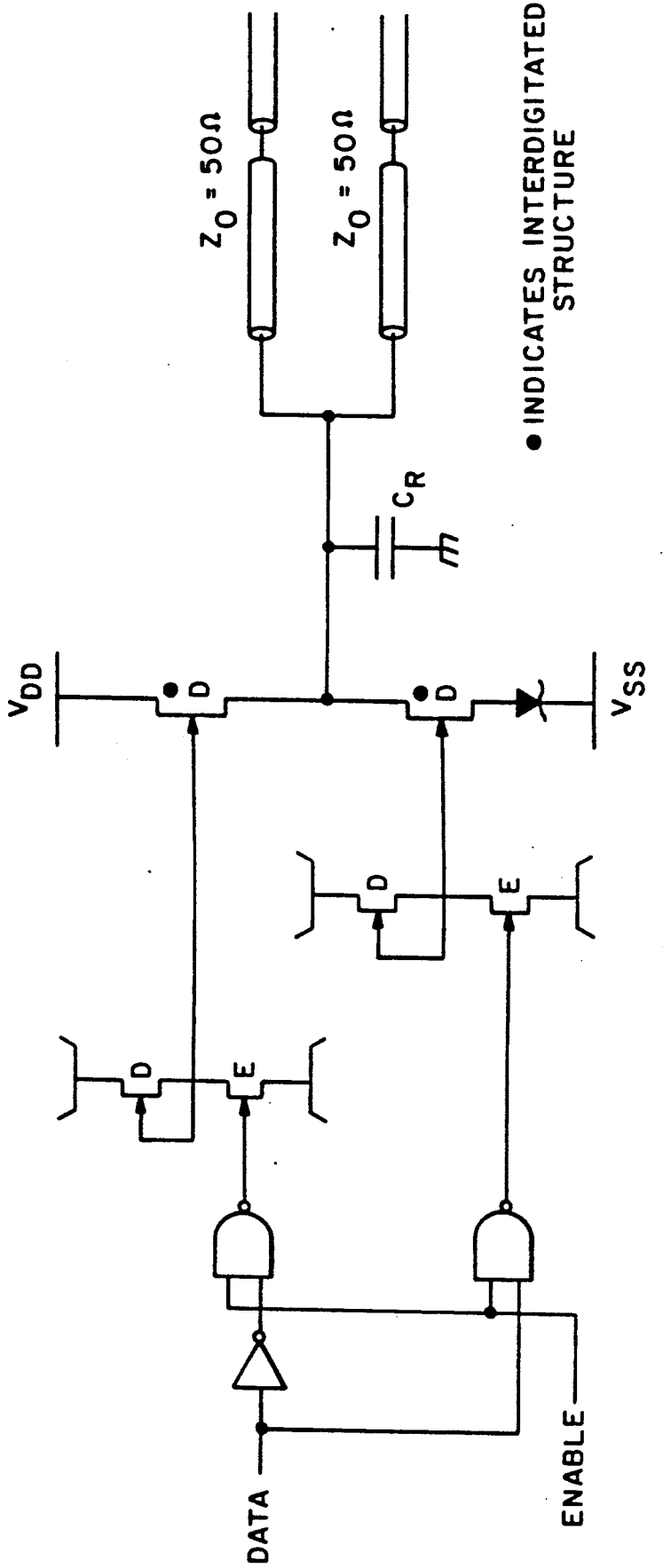
FIG. 26 is a schematic illustration of an enhancement-depletion mode gallium arsenide tristate output circuit for use in the integrated circuit chip of the tristate line driver system of FIG. 25.

The gallium arsenide integrated circuit components may be conventional driver, receiver or transceiver components. However, gallium arsenide tristate output integrated circuits, which have on, off and very low impedance states when not active are particularly desirable. Suitable enhancement/depletion mode tristate outputs, and depletion mode tristate output designs are shown in FIGS. 26 and 27, respectively.

Figure 25:
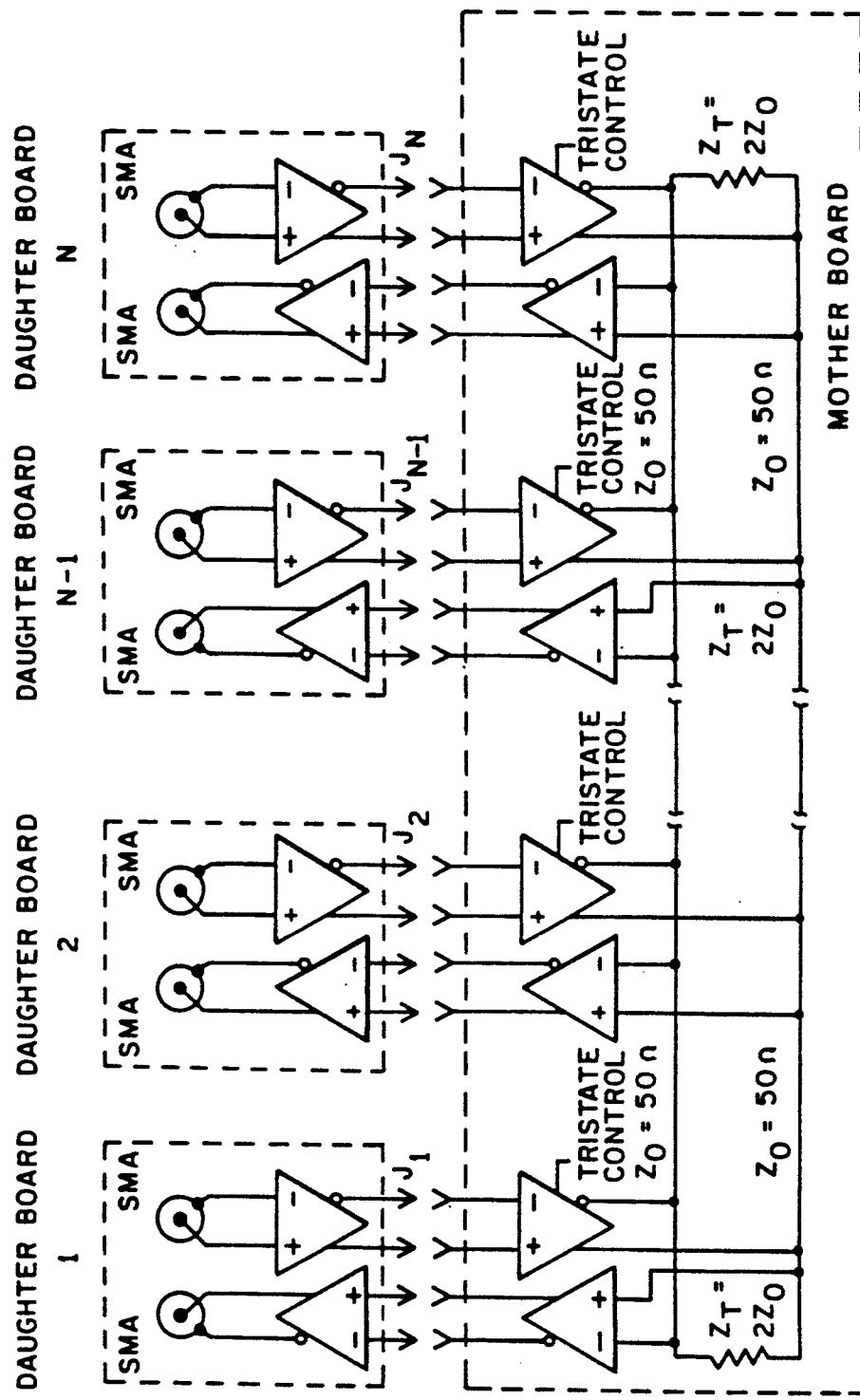
FIG. 25 is a block diagram of an end-tap single-bit bus like that of FIG. 5, which employs tristate line drivers.

A high-speed, active fast backplane system utilizing tristate line drivers is illustrated in FIG. 25. The main objective of the tristate circuitry is to achieve low capacitance at the output when set to a high impedance condition. Because gallium arsenide MESFETS are fabricated on a semi-insulating substrate, the bonding pad capacitance is made negligible in comparison to the intrinsic gate capacitance of the field effect transistor components. As shown in FIGS. 26 and 27, $C_r$ is the effective capacitive loading seen at the tristate tap. For the fast backplane integrated circuit systems, such as illustrated in FIG. 1, $C_r$ may be approximately equal to 0.2 picofarads, which is sufficiently low that minimal degradation to the transmitted signal occurs. The enhancement/depletion tristate system such as illustrated in FIG. 26 is preferable because of its substantially reduced power requirements of the phase-splitter circuitry.

Multiple driver/multiple receiver systems using the backplane design of the present invention and using the tri-state driver provides a data transmission system having high versatility. A general schematic diagram of this type of data pathway system is shown in FIG. 25, in which the effects of the delay between taps is accounted for in the data flow design. This delay is approximately 350 ps for the 0.9" daughterboard spacing of the system 10 of FIG. 1. A pipelined pathway organization which equalizes delays between pairs of processors and memories on the bus is important for most effective utilization of fast data bus structures. In the typical pathway, all path legends connecting processors to memories are different lengths resulting in different delays. In the optimum case, however, the loops from a given processor to a memory back to the processor are all the same length. These equal delays are much easier to account for in a processing system than the unequal delays of the typical configuration.

While the present invention has been described with respect to various specific embodiments, it will be appreciated that various modifications and adaptations will be apparent from the present disclosure and are intended to be within the spirit and scope of the following claims.

What is claimed is:

1. A very fast electrical data transmission pathway for connecting to at least one high speed integrated circuit comprising an integrated circuit chip carried by an integrated circuit package, said pathway comprising:
    a plurality of differential transmission lines external to the integrated circuit package;
    at least one continuous internal transmission line extending through said integrated circuit package;
    means for connecting said integrated circuit chip to said internal transmission line; and
    means for connecting said internal transmission line in electrical series with at least two of said plurality of differential transmission lines.

2. A data pathway in accordance with claim 1 wherein said integrated circuit chip is a gallium arsenide passive receiver circuit.

3. A data pathway in accordance with claim 1 wherein said integrated circuit chip is an active gallium arsenide tristate transceiver circuit.

4. A data pathway in accordance with claim 1 wherein said differential transmission lines each comprise coaxial transmission means.

5. A data pathway in accordance with claim 1 wherein said differential transmission lines are carried by a circuit board and said internal transmission line extends through said integrated circuit package between an input terminal and an output terminal thereof; and
    said means for connecting said internal transmission line with said differential transmission lines comprises means for connecting the input terminal to one of said plurality of differential transmission lines at said circuit board and means for connecting the output terminal to another of said plurality of differential transmission lines at said circuit board.

6. A data pathway in accordance with claim 5 wherein each of said plurality of differential transmission lines has a substantially equal characteristic impedance and said internal transmission line has an impedance substantially corresponding to the characteristic impedance of the differential transmission lines.

7. A data pathway in accordance with claim 6 wherein the input terminal and the output terminal each have an impedance substantially corresponding to the characteristic impedance of the differential transmission lines.

* * * * *